United States Patent
Morii et al.

(10) Patent No.: US 6,808,749 B2
(45) Date of Patent: Oct. 26, 2004

(54) THIN FILM FORMING METHOD, SOLUTION AND APPARATUS FOR USE IN THE METHOD, AND ELECTRONIC DEVICE FABRICATING METHOD

(75) Inventors: Katsuyuki Morii, Suwa (JP); Takashi Masuda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 90 days.

(21) Appl. No.: 10/267,639

(22) Filed: Oct. 10, 2002

(65) Prior Publication Data

US 2003/0099774 A1 May 29, 2003

(30) Foreign Application Priority Data

| Oct. 10, 2001 | (JP) | 2001-313226 |
| Oct. 10, 2001 | (JP) | 2001-313228 |
| Oct. 10, 2001 | (JP) | 2001-313229 |
| Oct. 10, 2001 | (JP) | 2001-313230 |
| Oct. 10, 2001 | (JP) | 2001-313231 |
| Oct. 10, 2001 | (JP) | 2001-313232 |
| Oct. 8, 2002 | (JP) | 2002-295159 |
| Oct. 8, 2002 | (JP) | 2002-295160 |
| Oct. 8, 2002 | (JP) | 2002-295161 |
| Oct. 8, 2002 | (JP) | 2002-295162 |
| Oct. 8, 2002 | (JP) | 2002-295163 |
| Oct. 8, 2002 | (JP) | 2002-295164 |

(51) Int. Cl.$^7$ ............................................. B05D 5/00
(52) U.S. Cl. ................. 427/256; 427/335; 427/336; 427/337; 427/385.5; 427/421
(58) Field of Search .................. 427/256, 335, 427/336, 377, 385.5, 421

(56) References Cited

FOREIGN PATENT DOCUMENTS

JP   A 10-41070   2/1998

OTHER PUBLICATIONS

A. Ulman, "An Introduction to Ultrathin Organic Film from Langmuir–Blodgett to Self–Assembly," Academic Press Inc., Boston Chapter 3, pp. 237–304 (1991), no month avail.

*Primary Examiner*—Bernard Pianalto
(74) *Attorney, Agent, or Firm*—Oliff & Berridge, PLC

(57) ABSTRACT

The present invention provides a method that is capable of crystallizing a very small amount of solution arranged on a substrate at a predetermined position. By ejecting a solution prepared by dissolving a thin film forming material in a solvent using an ink jet method, droplets of the solution are arranged on the substrate. Crystalline nuclei are created in the solution by controlling a partial pressure of a gas made up of the same components as those of the solvent in the vicinity of the droplets immediately after being arranged to, e.g., a value equal to or substantially equal to the saturation vapor pressure. After creation of the crystalline nuclei, the partial pressure of the gas in the vicinity of the droplets is reduced.

37 Claims, 7 Drawing Sheets

(a)

(b)

(c)

THIN FILM FORMING METHOD, SOLUTION AND APPARATUS FOR USE IN THE METHOD, AND ELECTRONIC DEVICE FABRICATING METHOD

BACKGROUND OF THE INVENTION

1. Field of Invention

The present invention relates to a thin film forming method including arranging, on a substrate, droplets of a solution prepared by dissolving a thin film forming material in a solvent. The present invention also relates to a thin film forming method including ejecting the solution to arrange a plurality of droplets of the solution on a substrate, and evaporating a solvent from each droplet, thereby forming a thin film on the substrate.

2. Description of Related Art

Recently, attention has been focused on electronic devices employing an organic thin film (thin film made of an organic substance) as a functional thin film. An example one of such electronic device is an organic EL device. One example of an organic thin film for use as a light emitting layer in an organic EL device is a thin film of Alq3 (quinolinol-aluminium complex) formed by vacuum deposition, for example. When that thin film is formed by an ordinary vacuum deposition process, it is not obtained in a crystal state, but in an amorphous state.

In the related art, a crystalline thin film of Alq3 can be obtained with the vacuum deposition process by providing a layer of fulleren as an underlying layer (see, e.g., Japanese Unexamined Patent Application Publication No. 10-41070). This Publication also discloses that, by employing, as a light emitting source, a crystalline Alq3 thin film formed by the disclosed method, the light emission efficiency of an organic EL device can be enhance from that in the case employing, as a light emitting source, a crystalline Alq3 thin film formed by the ordinary vacuum deposition process.

Also, in the related art, a crystalline organic thin film can be formed using a liquid phase process. Depending on the kinds of materials, a crystalline organic thin film can be formed, for example, by a method of spin-coating a solution of an organic substance. Examples of available materials includes a-sex-ithiophene, hexadecafluorocopper phthalocyanine, and naphthalene tetracarboxyl diimide.

On the other hand, a functional thin film is patterned when used in many electronic devices. However, it is difficult to pattern a crystalline organic thin film by an ordinary patterning process including photolithography and etching because of low resist resistance of the organic substance. The related art regarding various crystalline organic thin films of the above-mentioned type do not pattern the crystalline organic thin films. Accordingly, a selectable range of functional thin film materials for practical use is restricted and any desired material cannot always be employed. Furthermore, although crystallinity directly affects physical properties, the related art does not provide details regarding that effect.

If it is possible to arrange a very small amount of solution of an organic substance in a predetermined position on a substrate by an ink jet method and to crystallize the arranged solution, a patterned crystalline organic thin film can be easily formed on the substrate. Also, this method is able to form a crystalline thin film from all kinds of materials that can be dissolved into a solution, and to produce a perfect crystal (single crystal) in principle.

A thin film formed in the related art by the ink jet method is made of a high-molecular compound. Such a thin amorphous film made of a high-molecular compound can be readily formed by dissolving the high-molecular compound in a solvent to obtain a solution, arranging the solution on a substrate by the ink jet method, and evaporating the solvent from the arranged solution.

However, when making an effort to form a thin film using a compound having a relatively low molecular weight and not classified into high-molecular compounds (hereinafter "low-molecular compound") by the ink jet method similarly to the above-mentioned case using a high-molecular compound, a thin film made of the low-molecular compound is not formed and particles of the low-molecular compound are deposited on the substrate.

Such a result is attributable to the fact that, even with the substrate treated to become lyophilic, the cohesion among molecules of the low-molecular compound is much greater than the binding force between the low-molecular compound and the substrate. Thus, because a low-molecular compound has a great cohesion, it is a material having high crystallinity.

Further, when ejecting a solution by the ink jet method and arranging droplets on a substrate, if a partial pressure of a gas made up of the same components as those of a solvent for the solution forming the droplets is not uniform around each droplet, the droplet is distorted and tends to easily move toward the side in which the partial pressure is higher. That movement of the droplets is apt to particularly occur when a solution of a low-molecular compound having a weak binding force with respect to the substrate is ejected. Then, the movement of the droplets raises a difficulty in forming a thin film in a predetermined position on the substrate. As a result, the ununiformity of the partial pressure of the gas prevents the thin film from crystallized.

For example, when a plurality of droplets are formed along a line at small intervals between the droplets, the partial pressure around the droplet formed at the most end of the line is not uniform because the gas partial pressure is lower on the side where the adjacent droplet is not present and higher on the side where the adjacent droplet is present. The-reason that this occurs is because, around the droplet formed at the most end of the line, the gas partial pressure is higher on the side, in which the adjacent droplet is present, with the presence of solvent vapors vaporized from the adjacent droplet.

SUMMARY OF THE INVENTION

Accordingly, the present invention provides a method capable of crystallizing a very small amount of solution arranged in a predetermined position on a substrate so that a patterned crystalline thin film (particularly an organic thin film) can be easily formed on the substrate by the ink jet method.

To address or achieve the above, the present invention provides a thin film forming method including: arranging, on a substrate, a plurality of droplets of a solution prepared by dissolving a thin film forming material in a solvent, and evaporating the solvent from each droplet, thereby forming a thin film on the substrate. The gas partial pressure around each droplet formed on the substrate is kept uniform to prevent the above-mentioned movement of the droplet so that a thin film of a low-molecular compound can be formed in a predetermined position on the substrate.

Thus, to address or achieve the above, the present invention provides a thin film forming method including:

arranging, on a substrate, droplets of a solution prepared by dissolving a thin film forming material in a solvent, controlling a partial pressure of a gas made up of the same components as those of the solvent in the vicinity of the droplets, thereby creating crystalline nuclei in the droplets, and then growing the crystalline nuclei to form a crystalline thin film.

Also, as a thin film forming method for practically implementing a method of controlling the partial pressure, the present invention provides a thin film forming method including: arranging, on a substrate, droplets of a solution prepared by dissolving a thin film forming material in a solvent, creating crystalline nuclei in the droplets by controlling a partial pressure of a gas made up of the same components as those of the solvent in the vicinity of each of the arranged droplets to a first partial pressure (e.g., a partial pressure equal to or substantially equal to the saturation vapor pressure) under which the solution forming the droplets is brought into a supersaturated state, and after creation of the crystalline nuclei, lowering the partial pressure of the gas in the vicinity of the droplets to a second partial pressure (e.g., $\frac{1}{10}$ to $\frac{1}{100}$ of the saturation vapor pressure) under which the crystalline nuclei are able to grow into crystals.

Further, as another thin film forming method for practically implementing a method of controlling the partial pressure, the present invention provides a thin film forming method including: arranging, on a substrate, droplets of a solution prepared by dissolving a thin film forming material in a solvent, creating crystalline nuclei in the droplets by bringing the solution forming the arranged droplets into a supersaturated state and by controlling a partial pressure of a gas made up of the same components as those of the solvent in the vicinity of the droplets to a first partial pressure (e.g., a partial pressure equal to or substantially equal to the saturation vapor pressure) under which the solvent is hard to evaporate from the solution forming the droplets, and after creation of the crystalline nuclei, lowering the partial pressure of the gas in the vicinity of the droplets to a second partial pressure (e.g., $\frac{1}{10}$ to $\frac{1}{100}$ of the saturation vapor pressure) under which growth of the crystalline nuclei into crystals occurs with priority to creation of further crystalline nuclei.

With the last-mentioned method, the solution forming the droplets immediately after being arranged on the substrate is first brought into a supersaturated state, whereby crystalline nuclei necessary for crystallization are created in the solution. Then, the partial pressure of the gas (i.e., the gas made up of the same components as those of the solvent) in the vicinity of the droplets is lowered from the first partial pressure (i.e., a high partial pressure under which the solvent is hard to evaporate from the solution forming the droplets) to the second partial pressure (i.e., a low partial pressure under which the solvent is easy to evaporate from the solution forming the droplets and which growth of the created crystalline nuclei into crystals occurs with priority to creation of further crystalline nuclei).

Accordingly, with that method, a patterned crystalline thin film can be easily formed on the substrate, for example, by arranging the droplets in a predetermined pattern by the ink jet method.

In the case in which the volume of each of the droplets arranged on the substrate is very small on the order of, e.g., 20 picoliter as resulted when employing, for example, the ink jet method in the droplet arranging step, if the partial pressure of the gas (i.e., the gas made up of the same components as those of the solvent of the solution forming the droplets) in the vicinity of the droplets is low, the solvent is apt to easily evaporate from the droplets and the concentration of the solution forming the droplets is quickly increased. Hence, a degree of supersaturation of the solution is also quickly increased, whereby a number of crystalline nuclei are formed and a solute tends to be powdery. In contrast, according to the method of the present invention, since the partial pressure of the gas in the vicinity of the droplets immediately after being arranged is controlled to the first partial pressure (i.e., a high partial pressure under which the solvent is hard to evaporate from the solution forming the droplets), the concentration of the solution forming the droplets is made uniform and stabilized in a supersaturated state in which a degree of supersaturation is relatively low (namely, an increase rate of degree of supersaturation of the solution forming the droplets is moderated). As a result, a small number of nuclei (ideally one) is created.

Further, to form a single-crystal thin film, it is required that after one nucleus has been created, only the one nucleus is grown into a crystal while reducing or preventing creation of other nucleus. If the partial pressure of the gas in the vicinity of the droplets immediately after being arranged remains high, further nuclei are created. In contrast, according to the method of the present invention, after the creation of the crystalline nuclei, the partial pressure is reduced to the lower partial pressure under which growth of the created crystalline nuclei into crystals occurs with priority to creation of further crystalline nuclei (i.e., the second partial pressure), whereby the crystal growth is accelerated while reducing or preventing the creation of further crystalline nuclei.

According to the method of the present invention, therefore, the degree of supersaturation of the solution forming the droplets can be quickly increased and a crystalline thin film of a single crystal can be obtained by quickly lowering the partial pressure from the first partial pressure to the second partial pressure immediately after a small number of crystalline nuclei (ideally one) have been created in the solution, for example, by lowering the partial pressure from the first partial pressure, which is equal to or substantially equal to the saturation vapor pressure, to the second partial pressure of 1.3 Pa (10-2 torr) in a time of 1 to 10 seconds.

In the method of the present invention, a partial pressure control method for controlling the partial pressure to the first partial pressure can be implemented, for example, by (1) adjusting an ejection interval (array pitch) of the droplets, (2) adjusting an amount of the ejected solution (i.e., an amount of the solution forming each of the droplets), or (3) adjusting the partial pressure of the gas in positions where the droplets are to be arranged, prior to the droplet arranging step.

In the method of the present invention, a method for relatively lowering the partial pressure from the first partial pressure to the second partial pressure can be implemented, for example, by (1) depressurizing an atmosphere in the vicinity of the droplets, (2) raising temperature in the vicinity of the droplets (this method (2) is intended to relatively lower the partial pressure by changing the saturated vapor pressure instead of changing an absolute value of the partial pressure), or (3) replacing an atmosphere in the vicinity of the droplets with an atmosphere of inert gas.

In the method of the present invention, the solution forming the droplets immediately after being arranged must be brought into a supersaturated state. To that end, it is preferable to employ one of (1) a solution containing the thin film forming material in amount at which the solution is brought into the saturated state when the solution is ejected in the droplet arranging step, (2) a solution containing the thin film forming material in amount at which concentration of the solution becomes not less than 1/10 of the saturated concentration but less than the saturated concentration at the time of ejection of the solution, and (3) a solution containing the thin film forming material in amount at which the solution is brought into the supersaturated state at the time of ejection of the solution.

In the method of the present invention, as stated above, the solution forming the droplets immediately after being arranged on the substrate is brought into the supersaturated state at a relatively low level to create a small number of crystalline nuclei, and after the creation of the crystalline nuclei, the degree of supersaturation of the solution forming the droplets is quickly increased for acceleration of the crystal growth. To that end, the solution used in the method of the present invention is advantageously one that can be brought into the supersaturated state over a wide concentration range.

Herein, the term "degree of supersaturation" is defined by (C—Cs)/Cs where C is the concentration and Cs is the saturated concentration. Also, the term "poor solvent" means a solution having a small saturated concentration. By employing a poor solvent as the solvent, therefore, a solution capable of being brought into the supersaturated state over a wide concentration range is obtained. Also, the use of a poor solvent is advantageous in that the interaction between solutes is relatively small even in the supersaturated state, and hence flexibility required in forming crystals can be obtained at a sufficient level.

Thus, according to the method of the present invention, by employing, as the solvent, a poor solvent (e.g., a solvent having such a characteristic that the saturated concentration of the thin film forming material at the time of ejection of the solution is not less than 0.1 weight % but not more than 10.0 weight %, or a solvent having such a characteristic that the saturated concentration of the thin film forming material at the time of ejection of the solution is not less than 0.1 weight % but not more than 1.0 weight %), it is possible to easily achieve creation of a small number of crystalline nuclei and acceleration of the crystal growth. On the contrary, in the case employing a good solvent to prepare a solution that is brought into the supersaturated state, if a solute is, e.g., a highly crystalline organic substance, a solution having high viscosity and low fluidity is resulted and hence crystalline nuclei are hard to grow.

In the method of the present invention, the solution used is preferably one containing the thin film forming material in an amount at which the concentration of the solution is not less than 1/10 (including the saturated concentration and the supersaturated state) at the time of ejection of the solution. With this feature, the solution forming the droplets arranged on the substrate is more easily brought into the supersaturated state immediately after being ejected by the ink jet method, for example.

In the method of the present invention, dodecylbenzene is preferably used as the solvent. Dodecylbenzene becomes a poor solvent when an organic substance having high crystallinity, such as oligothiophene, is a solute. Also, since dodecylbenzene has a low vapor pressure, the use of dodecylbenzene enables the droplets to be easily controlled the supersaturated state.

In the method of the present invention, 2,3-dihydrobenzofuran is preferably used as the solvent. 2-3-Dihydrobenzofuran becomes a poor solvent when an organic substance having high crystallinity, such as oligophenylene, is a solute. Also, since 2-3-dihydrobenzofuran has a low vapor pressure, the use of 2-3-dihydrobenzofuran enables the droplets to be easily controlled the supersaturated state.

In the method of the present invention, dimethylformamide is preferably used as the solvent. Dimethylformamide becomes a poor solvent when an organic substance having high crystallinity, such as derivatives of oligophenylene or oligothiophene, is a solute. Also, since dimethylformamide has a low vapor pressure, the use of dimethylformamide enables the droplets to be easily controlled the supersaturated state.

The thin film forming material usable in the method of the present invention is, for example, oligophenylene or a derivative thereof, or oligothiophene or a derivative thereof. Oligophenylene is represented by the following chemical formula (1), and oligothiophene is represented by the following chemical formula (2). In each formula, n is equal to 2 or more. Also, in any case, n is preferably not less than 2 but not more than 6.

[Chemical Formula 1]

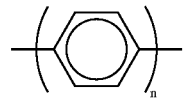

(1)

[Chemical Formula 2]

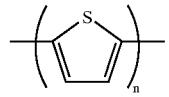

(2)

One example of oligophenylene is p-terphenyl represented by the following chemical formula (3). One example of oligothiophene is 2,2':5',2"-terthiophene represented by the following chemical formula (4). One example of oligophenylene derivatives is 4-amino-p-terphenyl represented by the following formula (5). One example of oligothiophene derivatives is 2,2':5',2"-terthiophene-5,5"-dicarboxyaldehyde represented by the following formula (6).

[Chemical Formula 3]

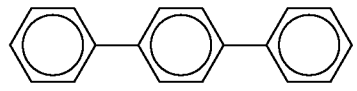

(3)

[Chemical Formula 4]

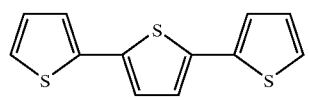

(4)

[Chemical Formula 5]

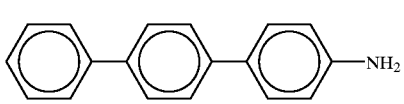

(5)

[Chemical Formula 6]

(6)

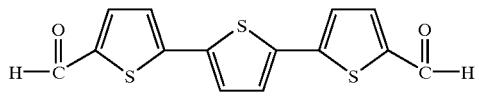

Another example of the thin film forming material usable in the method of the present invention is Alq3 (quinolinol-aluminium complex) represented by the following chemical formula (7)

[Chemical Formula 7]

(7)

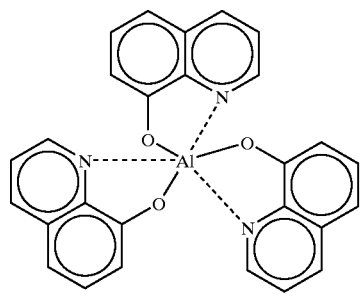

The solution used in the method of the present invention is, for example, one selected from among a solution in which the thin film forming material is oligophenylene and the solvent is 2,3-dihydrobenzofuran, a solution in which the thin film forming material is oligothiophene and the solvent is dodecylbenzene, and a solution in which the thin film forming material is a derivative of oligophenylene or a derivative of oligothiophene and the solvent is dimethylformamide.

Meanwhile, when a compound having a relatively low molecular weight and not classified into high-molecular compounds (hereinafter a "low-molecular compound") is ejected onto a substrate and then naturally dried, a thin film made of the low-molecular compound is not formed and particles of the low-molecular compound are deposited on the substrate. Such a result is attributable to the fact that, even with the substrate treated to become lyophilic, the cohesion among molecules of the low-molecular compound is much greater than the binding force between the low-molecular compound and the substrate. Because a low-molecular compound has a great cohesion, it is a material having high crystallinity. Thus, the thin film forming material used in the method of the present invention is a low-molecular compound.

According to the method of the present invention, by ejecting the solution after treating the substrate into a surface condition having an affinity with the thin film forming material (feature a), the thin film forming material dissolved in the ejected solution remains on the substrate in the surface condition having an affinity with the thin film forming material. As a result, the binding force between the thin film forming material made of the low-molecular compound and the substrate becomes higher than the cohesion among molecules of the thin film forming material, and the thin film forming material is stably cohered on the substrate, whereby a crystalline thin film can be more easily formed with stability.

As a method of treating the substrate into the surface condition having an affinity with the thin film forming material, it is preferable to employ a method of forming a self-assembly film on the substrate.

Herein, the term "self-assembly film" means a dense single-molecule film in which a compound having a functional group capable of binding with a constituent atom of the film forming surface is made present in a gaseous or liquid state together with the film forming surface, whereby the functional group is adsorbed onto the film forming surface and is bound to the constituent atom of the film forming surface so that normal chain molecules are formed toward the outer side. Such a single molecule film is called a self-assembly film because it is formed based on spontaneous chemical adsorption of a compound onto the film forming surface.

The self-assembly film is explained in detail in Chapter 3, "An Introduction to Ultrathin Organic Film from Langmuir-Blodgett to Self-Assembly", by A. Ulman (Academic Press Inc. Boston, 1991).

That method of adjusting the surface condition of the substrate with formation of the self-assembly film is a method that is capable of ensuring electrical continuity between the substrate and the thin film when the thin film formed by the method of the present invention is used as a functional thin film in an electrical device.

To obtain the substrate surface condition having an affinity with the thin film forming material by forming the self-assembly film, it is preferable, for example, to form, on the substrate, a self-assembly film made up of molecules each having an atomic group common to molecules constituting the thin film forming material.

When the thin film forming material used in the method of the present invention is oligophenylene or a derivative thereof, it is preferable, for example, to form, on the substrate, a self-assembly film made up of molecules each having a benzene ring at a terminal end or in its part. Also, when the thin film forming material used in the method of the present invention is oligothiophene or a derivative thereof, it is preferable, for example, to form, on the substrate, a self-assembly film made up of molecules each having a thiophene ring at a terminal end.

Further, the aforesaid feature a contains a method including: forming, on the substrate, a first area in a surface condition having a high affinity with the thin film forming material (i.e., an area corresponding to a thin film formed area) and a second area in a surface condition having a low affinity with the thin film forming material, and ejecting the solution such that the droplets are formed on the first area to entirely cover the first area.

In the above method, by way of example, the first area in the surface condition having a high affinity with the thin film forming material is disposed in a predetermined pattern, whereupon the remaining area on the substrate other than the first area defines the second area in the surface condition having a low affinity with the thin film forming material. Thereafter, the solution is ejected.

When a plurality of first areas are provided on the substrate, the solution is ejected such that the droplets are formed to entirely cover each of the plural first areas.

According to the above method, even when the thin film forming material dissolved in the ejected solution is formed with the droplets spreading over the second area upon ejection of the solution by the ink jet method, the droplets remain within the first area on the substrate, which is in the surface condition having a high affinity with the thin film forming material, and no droplets are present within the second area on the substrate, which is in the surface condition having a low affinity with the thin film forming material.

In the method of the present invention employing a low-molecular compound as the thin film forming material, therefore, a thin film is formed in the first area because the binding force between the thin film forming material and the substrate becomes higher than the cohesion among molecules of the thin film forming material. In the second area, however, any thin film forming material is not present and no particles of the thin film forming material are deposited. As a result, a crystalline thin film is formed on the substrate in the same pattern as the first area.

In the above method, preferably, the first area is provided by forming, on the substrate, a first self-assembly film made up of molecules each having an atomic group common to molecules constituting the thin film forming material, and the second area is provided by forming, on the substrate, a second self-assembly film made up of molecules each not having any atomic group common to molecules constituting the thin film forming material.

Further, the present invention provides a solution containing a thin film forming material and a solvent and used in a thin film forming method including: ejecting the solution and arranging droplets of the solution on a substrate, the solution being any of (1) a solution containing the thin film forming material in amount at which the solution is brought into the saturated state at the time of ejection of the solution, (2) a solution containing the thin film forming material in amount at which concentration of the solution is not less than 1/10 of the saturated concentration but less than the saturated concentration at the time of ejection of the solution, (3) a solution containing the thin film forming material in amount at which the solution is brought into the supersaturated state at the time of ejection of the solution, (4) a solution in which a solvent is a poor solvent, (5) a solution prepared such that the saturated concentration of the thin film forming material with respect to the solvent is not less than 0.1 weight % but not more than 10.0 weight % at the time of ejection of the solution, and (6) a solution prepared such that the saturated concentration of the thin film forming material with respect to the solvent is not less than 0.1 weight % but not more than 1.0 weight % at the time of ejection of the solution.

Still further, the present invention provides a solution that satisfies any of the above conditions (1) to (6) and is given as one of: (7) a solution in which the solvent is dodecylbenzene, (8) a solution in which the solvent is 2,3-dihydrobenzofuran, (9) a solution in which the solvent is dimethylformamide, (10) a solution in which the thin film forming material is oligophenylene or a derivative thereof, (11) a solution in which the thin film forming material is oligothiophene or a derivative thereof, (12) a solution in which the thin film forming material is oligophenylene and the solvent is 2,3-dihydrobenzofuran, (13) a solution in which the thin film forming material is oligothiophene and the solvent is dodecylbenzene, and (14) a solution in which the thin film forming material is a derivative of oligophenylene or a derivative of oligothiophene and the solvent is dimethylformamide.

Still further, the present invention provides a thin film forming apparatus (first thin film forming apparatus) including: a stage on which a substrate is placed, an ejection device to eject, as droplets, a solution prepared by dissolving a thin film forming material in a solvent, and a gas component adjusting device to change a gas composition in a space above the stage.

Still further, the present invention provides a thin film forming apparatus (second thin film forming apparatus) including: a stage on which a substrate is placed, an ejection device to eject, as droplets, a solution prepared by dissolving a thin film forming material in a solvent, a gas introducing device to introduce a gas of a predetermined composition in a space above the stage, and a depressurizing device to reduce a pressure in the space above the stage.

According to the thin film forming method of the present invention, as described above, a very small amount of solution arranged in the predetermined position on the substrate, can be crystallized. As a result, a patterned crystalline thin film can be easily formed on the substrate by the ink jet method.

Also, according to the thin film forming apparatus of the present invention, the thin film forming method of the present invention can be easily implemented.

Moreover, as a first method for achieving the above more specific object, the present invention provides a thin film forming method including: ejecting a solution prepared by dissolving a thin film forming material in a solvent, arranging a plurality of droplets of the solution on a substrate, and evaporating the solvent from each droplet to form a thin film on the substrate. The method further includes: making control such that a gas made up of the same components as those of the solvent is present around the droplets.

With the above method, the partial pressure of the aforesaid gas around the droplets can be increased to such an extent as not causing a problem of unevenness in the partial pressure of the gas around the droplets, which arises for the droplet formed at the most end of a line as described above. In other words, the partial pressure of the gas around the droplets can be kept uniform at a high value. As a result, it is possible to reduce or prevent movement of even the aforesaid droplet that is formed at the most end of a line.

The above control step can be implemented by a manner of coating the solvent over the substrate.

One practical manner includes, for example, coating the solvent over the substrate, and then ejecting the solution on a section over which with the solvent has been coated.

In the method of the present invention, the solvent may be coated over the entire substrate including positions in which the droplets of the solution are to be arranged, or may be coated only in positions in which the droplets of the solution are not to be arranged. From the viewpoint of arranging the droplets of the solution on the substrate which is in a condition perfectly free from adverse effects, such as contamination caused by the arranged solvent, however, the solvent is preferably coated only in positions in which the droplets of the solution are not to be arranged.

In the method of the present invention, the solvent can be coated by any of various methods such as spin coating, ink jetting, dipping, and spray coating. When coating the solvent over the entire substrate, the spin coating method is preferable from the viewpoint of workability.

When coating the solvent by the ink jet method, droplets of the solvent may be arranged before arranging the droplets of the solution, or at the same time as arranging the droplets of the solution, or after arranging the droplets of the solution. When arranging the droplets of the solvent after arranging the droplets of the solution, the droplets of the solvent must be arranged immediately (e.g., within 1 second) after arranging the droplets of the solution.

Also, when coating the solvent by the ink jet method, the droplets of the solvent and the droplets of the solution are preferably formed such that the droplets of the solvent are evenly arranged around the droplets of the solution on the substrate.

As a second method for achieving the above more specific advantage, the present invention provides a thin film forming method including: ejecting a solution prepared by dissolving a thin film forming material in a solvent, arranging a plurality of droplets of the solution on a substrate, and evaporating the solvent from each droplet to form a thin film on the substrate. A low vapor-pressure solvent having a vapor pressure of not higher than $1.3 \times 10^{-3}$ Pa ($1 \times 10^{-5}$ mmHg) at the time of ejection of the solution is used as the solvent.

With the above method, since the solvent is hard to evaporate from each of the droplets, each droplet is less susceptible to the effect of solvent vapors evaporated from the adjacent droplets even when the adjacent droplets are formed in positions relatively close to each other. As a result, even the aforesaid droplet formed at the most end of a line can be surely prevented from moving.

As a third method for achieving the above more specific advantage, the present invention provides a thin film forming method including: ejecting a solution prepared by dissolving a thin film forming material in a solvent, arranging a plurality of droplets of the solution on the substrate, and evaporating the solvent from each droplet to form a thin film on the substrate. The method further includes: after forming a first droplet, forming a second droplet in a position away a predetermined distance (distance sufficient to make negligible the effect of solvent vapors evaporated from the first droplet) from a position in which the first droplet has been formed.

With the third method, by forming the second droplet in the position in which it is not affected by solvent vapors evaporated from the first droplet, even the aforesaid droplet formed at the most end of a line can be surely prevented from moving.

Also, when the interval between adjacent two of the formed droplets is shorter than the predetermined distance (distance sufficient to make negligible the effect of solvent vapors evaporated from the first droplet), such a situation can be coped with the third method by: after forming the first droplet in a certain position, forming the next second droplet in a position away the predetermined distance from the position in which the first droplet has been formed, instead of a position in which the adjacent droplet is to be formed, and forming a droplet in the position, in which the adjacent droplet is to be formed, after drying of the first droplet.

As a fourth method for achieving the above more specific advantage, the present invention provides a thin film forming method including: ejecting a solution prepared by dissolving a thin film forming material in a solvent, arranging a plurality of droplets of the solution on the substrate, and evaporating the solvent from each droplet to form a thin film on the substrate. The method further includes: forming a second droplet in a position adjacent to a first droplet after drying of the first droplet.

With the fourth method, since the later-formed droplet (second droplet) is formed after drying of the droplet (first droplet) having been formed in the adjacent position, each droplet is less susceptible to the effect of solvent vapors evaporated from the adjacent droplet. As a result, even the aforesaid droplet formed at the most end of a line can be surely prevented from moving.

The thin film forming material usable in the methods described above is, for example, oligophenylene or a derivative thereof, or oligothiophene or a derivative thereof.

A crystalline thin film can be formed by the ink jet method by, after carrying out any of the above first to fourth methods, creating crystalline nuclei in the droplets by bringing the solution forming the arranged droplets into a supersaturated state and controlling a partial pressure of a gas made up of the same components as those of the solvent in the vicinity of the droplets to a first partial pressure under which the solvent is hard to evaporate from the solution forming the droplets, and after creation of the crystalline nuclei, lowering the partial pressure of the gas in the vicinity of droplets to a second partial pressure under which growth of the crystalline nuclei into crystals occurs with priority to creation of further crystalline nuclei.

According to the (first to fourth) thin film forming methods of the present invention, as described above, a thin film of a low-molecular compound can be formed in a predetermined position on a substrate. Also, by applying any of those methods to the method of forming a patterned crystalline thin film by the ink jet method, the crystalline thin film can be more easily formed in the predetermined position on the substrate with stability corresponding to a pattern. It is hence easy to form the patterned crystalline thin film.

In addition, the present invention provides an electronic device fabricating method including: forming a thin film in accordance with the thin film forming method of the present invention.

DETAILED DESCRIPTION OF PREFERRED EMBODIMENTS

Embodiments of the present invention will be described below.

Embodiment 1-1

A solution was prepared by dissolving p-terphenyl (thin film forming material) having the structure represented by the above-mentioned chemical formula (3) in 2,3-dihydrobenzofuran (solvent) at a concentration of 0.1 weight %. Also, ultraviolet rays were irradiated to a surface of a silicon substrate so that the surface became affinitive with ink (namely the surface had a property easily wettable with the solution).

The saturation concentration of p-terphenyl with respect to 2,3-dihydrobenzofuran at 25° C. (temperature at the time of ejection of the solution) is 1.0 weight %. Therefore, the concentration of p-terphenyl in the prepared solution was 1/10 of the saturation concentration at the time of ejection of the solution.

Figure 1:
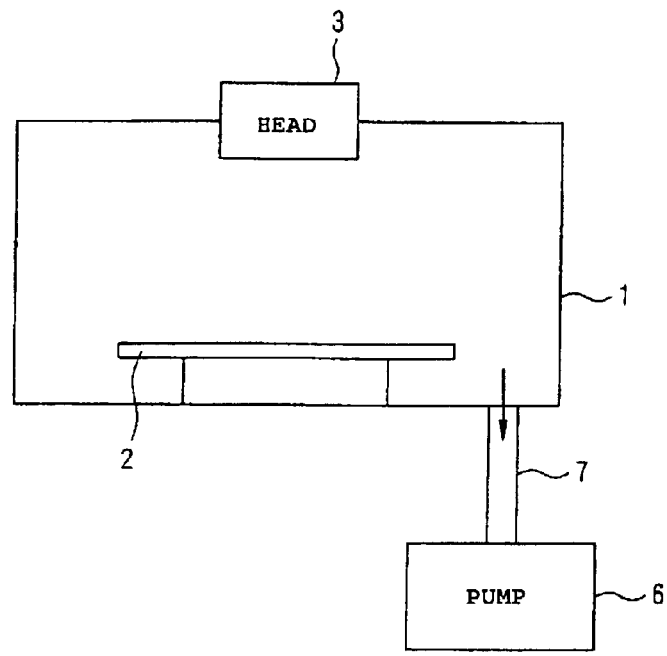
FIG. 1 is a schematic showing a thin film forming apparatus capable implementing a method of the present invention.

Then, a thin film was formed on the silicon substrate using a thin film forming apparatus shown in FIG. 1. The thin film forming apparatus includes an enclosed container 1, an X-Y stage 2 mounted in the enclosed container 1, a head 3 of an ink jet device, and a pump 6 and a pipe 7 to reduce the pressure in the enclosed container 1.

The head 3 is fixed to a top portion of the enclosed container 1, and the solution is supplied to the head 3 from the outside. The head 3 and the X-Y stage 2 are disposed in positions facing each other. The pipe 7 for the pump 6 is connected to a bottom portion of the enclosed container 1.

Ink Jet Device "MJ-930C" manufactured by Seiko Epson Corporation was employed as the ink jet device. The head 3 employed here had a single nozzle.

First, the silicon substrate treated as described above was placed on the X-Y stage 2 of the apparatus, and the enclosed container 1 was airtightly closed. Then, the inner space of the enclosed container 1 was held at 25° C., and the solution was ejected from the head 3 onto the substrate surface in amount of 20 picoliter per droplet. The ejection of the solution was repeated 10 times while moving the X-Y stage 2 along one side of the substrate in units of 210 $\mu$m. The distance between the head nozzle and the substrate was set to 1 $\mu$m. As a result, 10 droplets were formed at pitch of 210 $\mu$m along one straight line on the substrate.

At the same time as finishing the above step of forming the droplets, operation of the depressurizing pump 6 was started to reduce the pressure in the enclosed container 1 to 1.3 Pa (10-2 torr), and this depressurized state was held for 6 hours. On the silicon substrate taken out of the enclosed container 1 after 6 hours, a thin film (thickness of 0.5 mm) of p-terphenyl in a nearly rhombus shape having each side of 20 $\mu$m to 30 $\mu$m was formed substantially in a single crystal condition at each of the positions where the droplets had been formed. The single-crystal thin film of p-terphenyl is a functional thin film suitably usable as a semiconductor film for various kinds of electronic devices.

On the other hand, exactly the same process as that described above was carried out except that droplets were formed at pitch of 420 $\mu$m. As a result, on the silicon substrate taken out of the enclosed container 1 after 6 hours, a micro-crystal of p-terphenyl in a nearly rhombus shape having sides that are each not longer than 1 $\mu$m was formed at each of the positions where the droplets had been formed. A similar result was also obtained when the droplets were formed at pitch of 560 $\mu$m.

In this embodiment, since the concentration of the solution at the time of ejection thereof was 1/10 of the saturated concentration, the solution forming the droplets were relatively easily brought into a supersaturated state immediately after being arranged on the substrate. Also, by forming the droplets at pitch of 210 $\mu$m with the amount of the ejected solution per droplet set to 20 picoliter, the partial pressure of a gas of 2,3-dihydrobenzofuran (i.e., the same components as those of the solvent) in the vicinity of the droplets immediately after being arranged was held at a high partial pressure under which 2,3-dihydrobenzofuran (solvent) was hard to evaporate from the solution in the form of the droplets. Presumably, in those situations, the solution in the form of the droplets was stabilized in the supersaturated state at a relatively low degree of supersaturation and a small number of nuclei were formed.

To the contrary, in the case forming the droplets at pitch of 420 $\mu$m and 560 $\mu$m while ejecting the solution in the same amount, a large number of nuclei were formed presumably for the reason that the partial pressure of the gas immediately after arranging the droplets was not increased to such a high level as that obtained in the case forming the droplets at pitch of 210 $\mu$m.

Furthermore, presumably, by starting to reduce the pressure in the enclosed space (enclosed container 1) at the same time as finishing the step of forming the droplets, the partial pressure of solvent vapors in the vicinity of the droplets were quickly lowered in the stage in which a small number of nuclei were formed, and the degree of supersaturation of the solution in the form of the droplets was quickly increased, thus leading to a state in which growth of the crystalline nuclei into crystals occurred with priority to creation of further crystalline nuclei. Then, the crystal growth was accelerated by holding such a depressurized state for 6 hours.

To reliably perform the depressurizing operation, in this embodiment, a partition plate may be disposed to partition the head 3 from the stage 2 and the pipe 7. With the provision of the partition plate, it is just required to reduce the pressure in the enclosed container 1 only on the side where the state is mounted, without reducing the pressure on the side where the head is mounted. In other embodiments described below, such a partition plate may be likewise disposed as required.

Embodiment 1-2

Exactly the same process as that in Embodiment 1-1 was carried out except that the amount of the ejected solution per droplet was set to 40 picoliter. The pitch at which the droplets were formed was set to 420 $\mu$m. As a result, on the silicon substrate taken out of the enclosed space after 6 hours, a thin film (thickness of 0.8 mm) of p-terphenyl in a nearly rhombus shape having sides that are each 20 $\mu$m to 30 $\mu$m was formed substantially in a single crystal condition at each of the positions where the droplets had been formed.

Note that since the amount of the ejected solution per droplet is 20 picoliter in Embodiment 1-1, an example in which the droplets are formed at pitch of 420 $\mu$m in Embodiment 1-1 represents a comparative (control) example for this Embodiment 1-2. In the comparative example, on the silicon substrate taken out of the enclosed space after 6 hours, a micro-crystal of p-terphenyl in a nearly rhombus shape having sides that are each not longer than 1 $\mu$m was formed at each of the positions where the droplets had been formed.

Those results are presumably attributable to the following reason. In the case forming the droplets at pitch of 420 $\mu$m, by setting the amount of the ejected solution per droplet to 40 picoliter, the partial pressure of a gas of 2,3-dihydrobenzofuran in the vicinity of the droplets immediately after being arranged was held at a high partial pressure under which 2,3-dihydrobenzofuran (solvent) was hard to evaporate from the solution in the form of the droplets, whereby a small number of nuclei were formed. On the other hand, when the amount of the ejected solution per droplet was set to 20 picoliter, the partial pressure of the gas was not raised up to the above-mentioned high level immediately after arranging the droplets and hence a large number of nuclei were formed.

Embodiment 1-3

Exactly the same process as that in Embodiment 1-1 was carried out except that the solvent (2,3-dihydrobenzofuran) was coated on the substrate surface immediately before ejection of the solution by spin coating (for 30 seconds at rotational speed of 2000 rpm). The pitch at which the droplets were formed was set to 420 μm. As a result, on the silicon substrate taken out of the enclosed space after 6 hours, a thin film (thickness of 0.1 mm) of p-terphenyl in a nearly rhombus shape having sides that are each 20 μm to 30 μm was formed substantially in a single crystal condition at each of the positions where the droplets had been formed.

An example in which the droplets are formed at pitch of 420 μm in Embodiment 1-1 represents a comparative (control) example for this Embodiment 1-2. In the comparative example, on the silicon substrate taken out of the enclosed space after 6 hours, as described above, a microcrystal of p-terphenyl in a nearly rhombus shape having sides that are each not longer than 1 μm was formed at each of the positions where the droplets had been formed.

Those results are presumably attributable to the following reason. In the case forming the droplets at pitch of 420 μm, by coating the solvent of the solution on the substrate surface immediately before ejection of the solution of the thin film forming material, the partial pressure of a gas of 2,3-dihydrobenzofuran in the vicinity of the droplets immediately after being arranged was held at a high partial pressure under which 2,3-dihydrobenzofuran (solvent) was hard to evaporate from the solution in the form of the droplets, whereby a small number of nuclei were formed. On the other hand, when the solvent was not coated, the partial pressure of the gas was not raised up to the above-mentioned high level and hence a large number of nuclei were formed.

Embodiment 1-4

A solution was prepared by dissolving terthiophene (2,2':5',2''-terthiophene, thin film forming material) having the structure represented by the above-mentioned chemical formula (4) in dodecylbenzene (solvent) at a concentration of 1.0 weight %. The saturation concentration of terthiophene with respect to dodecylbenzene at 25° C. (temperature at the time of ejection of the solution) is 1.0 weight %. In this solution, therefore, terthiophene was brought into a saturated state at the time of ejection of the solution.

Using the solution thus prepared, a thin film was formed in the same manner as that in Embodiment 1-1 with the amount of the ejected solution per droplet set to 20 picoliter and the ejection pitch set to 210 μm.

As a result, on the silicon substrate taken out of the enclosed space after 6 hours, a thin film (thickness of 0.5 mm) of terthiophene in a nearly rectangular shape of 10 μm×5 μm was formed substantially in a single crystal condition at each of the positions where the droplets had been formed. The single-crystal thin film of terthiophene is a functional thin film suitably usable as a semiconductor film for various kinds of electronic devices.

Embodiment 1-5

A solution was prepared by dissolving 4-amino-p-terphenyl (derivative of terphenyl, thin film forming material) having the structure represented by the above-mentioned chemical formula (5) in dimethylformamide (solvent) at a concentration of 1.0 weight %. The saturated concentration of 4-amino-p-terphenyl with respect to dimethylformamide at 25° C. (temperature at the time of ejection of the solution) is 1.0 weight %. In this solution, therefore, 4-amino-p-terphenyl was brought into a saturated state at the time of ejection of the solution.

Using the solution thus prepared, a thin film was formed in the same manner as that in Embodiment 1-1 with the amount of the ejected solution per droplet set to 20 picoliter and the ejection pitch set to 210 μm.

As a result, on the silicon substrate taken out of the enclosed space after 6 hours, a thin film (thickness of 0.1 mm) of 4-amino-p-terphenyl in a nearly rhombus shape having sides that are each 20 μm to 30 μm was formed substantially in a single crystal condition at each of the positions where the droplets had been formed. The single-crystal thin film of 4-amino-p-terphenyl is a functional thin film suitably usable as a semiconductor film for various kinds of electronic devices.

Embodiment 1-6

A solution was prepared by dissolving 2,2':5',2''-terthiophene-5,5''-dicarboxyaldehyde (derivative of terthiophene, thin film forming material) having the structure represented by the above-mentioned chemical formula (6) in dimethylformamide (solvent) at a concentration of 1.0 weight %. The saturated concentration of the derivative with respect to dimethylformamide at 25° C. (temperature at the time of ejection of the solution) is 1.0 weight %. In this solution, therefore, the derivative was brought into a saturated state at the time of ejection of the solution.

Using the solution thus prepared, a thin film was formed in the same manner as that in Embodiment 1-1 with the amount of the ejected solution per droplet set to 20 picoliter and the ejection pitch set to 210 μm.

As a result, on the silicon substrate taken out of the enclosed space after 6 hours, a thin film (thickness of 0.1 mm) of 2,2':5',2''-terthiophene-5,5''-dicarboxyaldehyde in a nearly rhombus shape having sides that are each 20 μm to 30 μm was formed substantially in a single crystal condition at each of the positions where the droplets had been formed. The single-crystal thin film of 2,2':5',2''-terthiophene-5,5''-dicarboxyaldehyde is a functional thin film suitably usable as a semiconductor film for various kinds of electronic devices.

Embodiment 1-7

A solution was prepared by dissolving Alq3 (quinolinol-aluminium complex, thin film forming material) having the structure represented by the above-mentioned chemical formula (7) in 2,3-dihydrobenzofuran (solvent) at a concentration of 0.1 weight %. The saturated concentration of Alq3 with respect to 2,3-dihydrobenzofuran at 25° C. is 1.0 weight %. In this solution, therefore, the concentration of Alq3 was 1/10 of the saturated concentration at the time of ejection of the solution.

Using the solution thus prepared, a thin film was formed in the same manner as that in Embodiment 1-1 with the amount of the ejected solution per droplet set to 20 picoliter and the ejection pitch set to 210 μm.

As a result, on the silicon substrate taken out of the enclosed space after 6 hours, a thin film of Alq3 with a thickness of 0.1 μm in an needlelike shape having a length of 30 μm was formed substantially in a single crystal condition at each of the positions where the droplets had been formed. The single-crystal thin film of Alq3 is a functional thin film suitably usable as, e.g., a light emitting layer and an electron injection/transport layer of an organic EL device.

Embodiment 1-8

Figure 2:
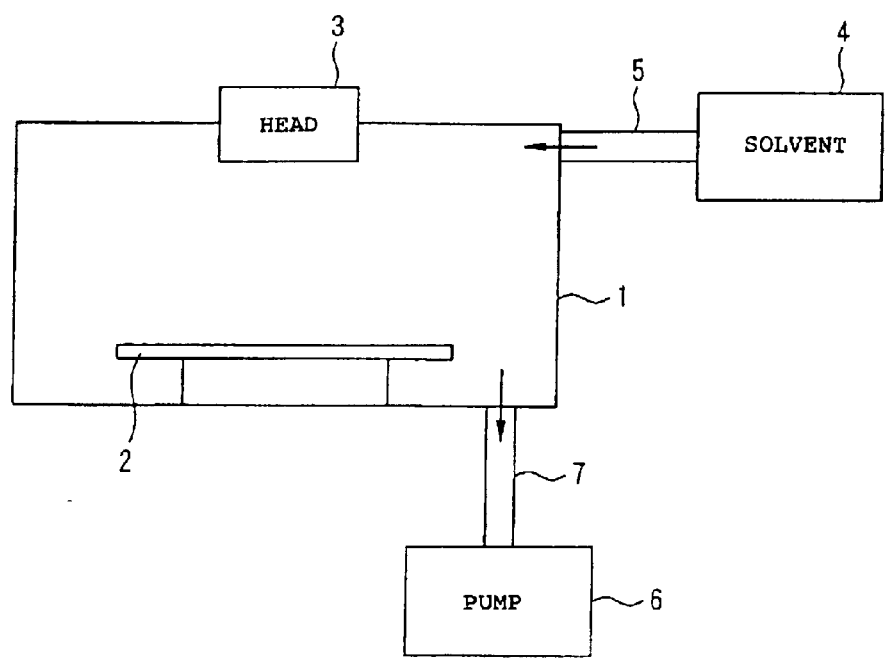
FIG. 2 is a schematic showing one embodiment of the thin film forming apparatus of the present invention.

A thin film was formed in accordance with a method corresponding to one embodiment of the present invention by using a thin film forming apparatus shown in FIG. 2.

The apparatus shown in FIG. 2 includes an enclosed container 1, an X-Y stage 2 mounted in the enclosed container 1, a head 3 of an ink jet device, a tank 4 and a pipe 5 to introduce a gas having the same components as the solvent (2,3-dihydrobenzofuran) into the enclosed container 1, and a pump 6 and a pipe 7 for reducing the pressure in the enclosed container 1.

The head 3 is fixed to a top portion of the enclosed container 1, and the same solution as that used in Embodiment 1-1 is supplied to the head 3 from the outside. The head 3 employed here has a single nozzle. The head 3 and the X-Y stage 2 are disposed in positions facing each other. The solvent of the prepared solution, i.e., 2,3-dihydrobenzofuran, is stored in the tank 4, and the pipe 5 for the tank 4 is connected to an upper portion of a sidewall of the enclosed container 1. The pipe 7 for the pump 6 is connected to a bottom portion of the enclosed container 1.

First, the silicon substrate treated in the same manner as in Embodiment 1-1 was placed on the X-Y stage 2 of the apparatus, and the enclosed container 1 was airtightly closed. Then, a gas of 2,3-dihydrobenzofuran was introduced from the tank 4 to the enclosed container 1, and the partial pressure of 2,3-dihydrobenzofuran in the enclosed container 1 was held at the saturated vapor pressure.

Subsequently, the solution was ejected from the head 3 onto a surface of the substrate on the X-Y stage 2 in amount of 20 picoliter per droplet. The ejection of the solution was repeated 10 times while moving the X-Y stage 2 along one side of the substrate in units of 420 $\mu$m. The distance between the head nozzle and the substrate was set to 1 $\mu$m. As a result, 10 droplets were formed at pitch of 420 $\mu$m along one straight line on the substrate.

At the same time as finishing the above step of forming the droplets, the introduction of the gas from the tank 4 to the enclosed container 1 is stopped and operation of the depressurizing pump was started to reduce the pressure in the enclosed container 1 to 1.3 Pa (10-2 torr). Then, this depressurized state was held for 6 hours. On the silicon substrate taken out of the enclosed container 1 after 6 hours, a thin film (thickness of 0.5 mm) of p-terphenyl in a nearly rhombus shape having sides that are each 20 $\mu$m to 30 $\mu$m was formed substantially in a single crystal condition at each of the positions where the droplets had been formed.

Embodiment 1-9

A silicon substrate treated in the same manner as in Embodiment 1-1 was placed on a stage provided with a built-in hot plate. The same solution as that used in Embodiment 1-1 was ejected onto a surface of the treated silicon substrate in the same manner as that in Embodiment 1-1 while the hot plate was kept in a not-heated state. As a result, 10 droplets were formed at pitch of 210 $\mu$m along one straight line on the substrate.

At the same time as finishing the above step of forming the droplets, the hot plate was heated and the substrate on the hot plate was held to each of temperatures 30° C., 50° C. and 70° for 15 minutes. When the temperature was held at 50° C., on the silicon substrate taken out of the enclosed space after 15 minutes, a thin film (thickness of 0.4 mm) of p-terphenyl in a nearly rhombus shape having each side of 30 $\mu$m was formed substantially in a single crystal condition at each of the positions where the droplets had been formed. When the temperature was held at 30° C., a micro-crystal of p-terphenyl in a nearly rhombus shape having each side of not longer than 1 $\mu$m was formed at each of the positions where the droplets had been formed. When the temperature was held at 70° C., a thin film (thickness of 0.3 mm) of p-terphenyl in a nearly droplike shape having a major axis of about 30 $\mu$m was formed substantially in an amorphous condition at each of the positions where the droplets had been formed.

When the substrate was held to stand as it is for 15 minutes without heating the hot plate, on the silicon substrate taken out of the enclosed space after 15 minutes, an aggregate of p-terphenyl in a polycrystalline condition containing many grain boundaries and having a rugged surface was formed or a micro-powder of p-terphenyl was deposited at each of the positions where the droplets had been formed.

In this embodiment, the relative reduction in the partial pressure of the gas having the same components as those of the solvent in the vicinity of the droplets after formation of nuclei is performed by heating the hot plate and raising the temperature in the vicinity of the droplets.

Embodiment 1-10

Figure 3:
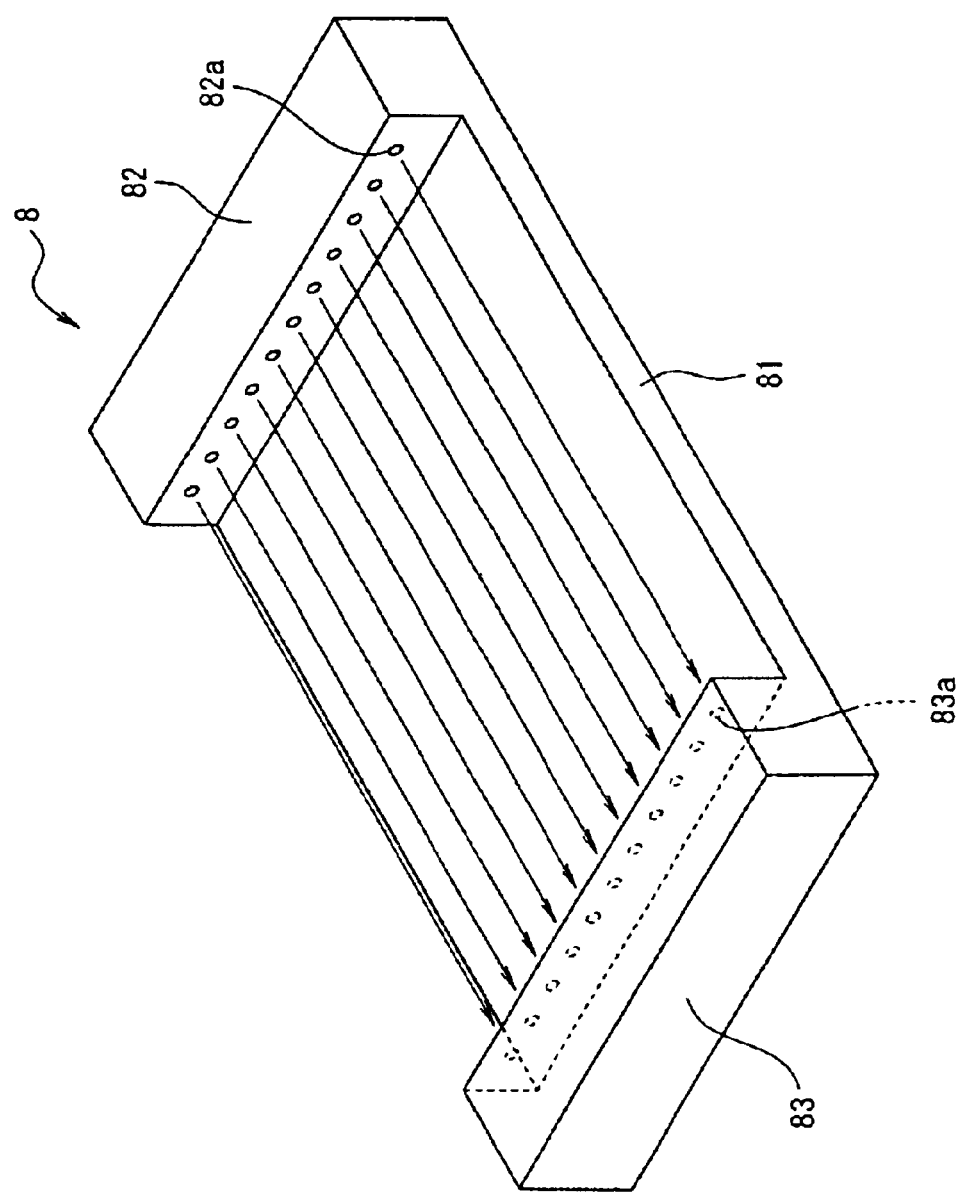
FIG. 3 is a schematic perspective view showing a stage used to replace an atmosphere in the vicinity of droplets with an atmosphere of inert gas.

A stage 8 shown in FIG. 3 was prepared. The stage 8 includes a rectangular base 81 on which a substrate is placed, a gas blow-off section 82 provided at one end of the base 81 in the longitudinal direction, and a gas sucking section 83 provided at the other end of the base 81. The gas blow-off section 82 has a large number of blow-off ports 82a formed at equal intervals in the transverse direction. The gas sucking section 83 has a large number of suction ports 83a formed at equal intervals in the transverse direction. The blow-off ports 82a and the suction ports 83a are formed at a level 30 cm above the base 81 in an opposing relation.

An inert gas is introduced to the gas blow-off section 82 from the outside, and the introduced inert gas is blown off toward the opposing suction ports 83a through the blow-off ports 82a. The blown-off inert gas is sucked into the gas sucking section 83 through the suction ports 83a. A laminar flow of the inert gas is thereby formed over the base 81.

First, the stage 8 was set in the enclosed space, the substrate was placed on the stage 8, and the solution was ejected in the same manner as in Embodiment 1-1. At this time, the laminar flow of the inert gas was not formed by the stage 8, and droplets were formed in air under the atmospheric pressure in the same manner as in Embodiment 1-1. As a result, 10 droplets were formed at pitch of 210 $\mu$m along one straight line on the substrate.

At the same time as finishing the above step of forming the droplets, the laminar flow of the inert gas was formed by the stage 8 and the substrate was left to stand in that state for 15 minutes. A nitrogen gas was blown off as the inert gas at 0.2 MPa. On the silicon substrate taken out of the enclosed space after that, a thin film (thickness of 0.5 mm) of p-terphenyl in a nearly rhombus shape having each side of 10 $\mu$m was formed substantially in a single crystal condition at each of the positions where the droplets had been formed. However, several grain boundaries were present in some areas of the formed thin film.

In this embodiment, the reduction in the partial pressure of the gas having the same components as those of the solvent in the vicinity of the droplets after formation of nuclei is performed by replacing an atmosphere in the vicinity of the droplets with an atmosphere of the inert gas.

The apparatus of FIG. 2 represents one embodiment of the second thin film forming apparatus of the present invention. Then, the tank 4 and the pipe 5 correspond to a gas introducing device stated in claims of the present invention, and the pump 6 and the pipe 7 correspond to a depressurizing device. Also, an apparatus obtained by omitting the pump 6 and the pipe 7 from FIG. 2 represents one embodiment of the first thin film forming apparatus of the present invention. In that case, the tank 4 and the pipe 5 correspond to a gas component adjusting device stated in claims of the present invention.

Further, another example of the apparatus capable of implementing the method of the present invention is provided by any of (1) a modification of the apparatus of FIG. 2 in which the tank 4, the pump 6, and the pipes 5, 7 are omitted and a device functioning as both a hot plate and a spin coater is provided on the stage 2, (2) a modification of the apparatus of FIG. 2 in which the tank 4 and the pipe 5 are omitted and a spin coater is provided on the stage 2, and (3) a modification of the apparatus of FIG. 2 in which the pump 6 and the pipe 7 are omitted and a hot plate is provided on the stage 2.

In each of the above-described embodiments, by starting to reduce the pressure in the enclosed space at the same time as finishing the step of forming the droplets, the first partial pressure is quickly lowered to the second partial pressure to quickly increase the degree of supersaturation of the solution forming the droplets so that a crystalline thin film of a single crystal is obtained. However, the timing of starting the depressurization is not limited to the same timing as finishing the step of forming the droplets, and the depressurization may be started at any suitable timing depending on other conditions.

Embodiment 2-1

First, a solution A was prepared by dissolving p-terphenyl (thin film forming material) having the structure represented by the above-mentioned chemical formula (3) in 2,3-dihydrobenzofuran (solvent) at a concentration of 0.01 weight %. Likewise, a solution B was prepared by dissolving p-terphenyl at a concentration of 0.1 weight %. Also, ultraviolet rays were irradiated to a surface of a silicon substrate so that the surface became lyophilic (namely the surface had a property easily wettable with the solution).

Note that the saturated concentration of p terphenyl with respect to 2,3-dihydrobenzofuran at 25° C. (temperature at the time of ejection of the solution) is 1.0 weight %. Therefore, the concentration of p terphenyl in the solution A was 1/100 of the saturated concentration at the time of ejection of the solution, and the concentration of p-terphenyl in the solution B was 1/10 of the saturated concentration at the time of ejection of the solution.

Then, a thin film was formed on the silicon substrate using the thin film forming apparatus shown in FIG. 1. The thin film forming apparatus includes an enclosed container 1, an X-Y stage 2 mounted in the enclosed container 1, a head 3 of an ink jet device, and a pump 6 and a pipe 7 to reduce the pressure in the enclosed container 1.

The head 3 is fixed to a top portion of the enclosed container 1, and the solution is supplied to the head 3 from the outside. The head 3 and the X-Y stage 2 are disposed in positions facing each other. The pipe 7 for the pump 6 is connected to a bottom portion of the enclosed container 1.

First, the silicon substrate treated as described above was placed on the X-Y stage 2 of the apparatus, and the enclosed container 1 was airtightly closed. Then, the inner space of the enclosed container 1 was held at 25° C., and the solution was ejected from the head 3 onto the substrate surface in amount of 20 picoliter per droplet. The ejection of the solution was repeated 10 times while moving the X-Y stage 2 along one side of the substrate in units of 210 μm. The distance between the head nozzle and the substrate was set to 1 μm. As a result, 10 droplets were formed at pitch of 210 μm along one straight line on the substrate.

At the same time as finishing the above step of forming the droplets, operation of the depressurizing pump 6 was started to reduce the pressure in the enclosed container 1 to 1.3 Pa (10-2 torr), and this depressurized state was held for 6 hours. In the case using the solution B, on the silicon substrate taken out of the enclosed container 1 after 6 hours, a thin film (thickness of 0.5 mm) of p-terphenyl in a nearly rhombus shape having each side of 20 μm to 30 μm was formed substantially in a single crystal condition at each of the positions where the droplets had been formed. The crystalline thin film of p-terphenyl is a functional thin film suitably usable as a semiconductor film for various kinds of electronic devices.

On the other hand, in the case using the solution A, on the silicon substrate taken out of the enclosed container 1 after 6 hours, a micro-powder was formed at each of the positions where the droplets had been formed.

In the case using the solution B in this embodiment, since the concentration of the solution at the time of ejection thereof was 1/10 of the saturation concentration, the solution forming the droplets were relatively easily brought into a supersaturated state immediately after being arranged on the substrate. Also, by forming the droplets at pitch of 210 μm with the amount of the ejected solution per droplet set to 20 picoliter, the partial pressure of a gas of 2,3-dihydrobenzofuran (i.e., the same components as those of the solvent) in the vicinity of the droplets immediately after being arranged was held at a high partial pressure under which 2,3-dihydrobenzofuran (solvent) was hard to evaporate from the solution in the form of the droplets. Presumably, in those situations, the solution in the form of the droplets was stabilized in the supersaturated state at a relatively low degree of supersaturation and a small number of nuclei were formed.

Furthermore, presumably, by starting to reduce the pressure in the enclosed space (enclosed container 1) at the same time as finishing the step of forming the droplets, the partial pressure of solvent vapors in the vicinity of the droplets were quickly lowered in the stage in which a small number of nuclei were formed, and the degree of supersaturation of the solution in the form of the droplets was quickly increased, thus leading to a state in which growth of the crystalline nuclei into crystals occurred with priority to creation of further crystalline nuclei. Then, the crystal growth was accelerated by holding such a depressurized state for 6 hours.

On the other hand, in the case using the solution A, crystal nuclei were not formed presumably for the reason that since the concentration of the solution at the time of ejection thereof was 1/100 of the saturation concentration, the solution forming the droplets immediately after being arranged on the substrate was not brought into the supersaturated state.

Embodiment 2-2

A solution C was prepared by dissolving terthiophene (2,2':5',2"-terthiophene, thin film forming material) having the structure represented by the above-mentioned chemical formula (4) in dodecylbenzene (solvent) at a concentration of 1.0 weight %. The saturated concentration of terthiophene with respect to dodecylbenzene at 25° C. (temperature at the time of ejection of the solution) is 1.0 weight %. In this solution C, therefore, terthiophene was brought into a saturated state at the time of ejection of the solution.

Exactly the same process as that in Embodiment 2-1 was carried out except for using the solution C. As a result, on the silicon substrate taken out of the enclosed container 1 after 6 hours, a thin film (thickness of 0.5 mm) of terthiphene in a nearly rectangular shape of 10 μm×5 μm was formed substantially in a single crystal condition at each of the positions where the droplets had been formed. The crystalline thin film of terthiophene is a functional thin film suitably usable as a semiconductor film for various kinds of electronic devices.

In this embodiment, a small number of nuclei were presumably formed because of not only that the solution was brought into the saturated state at the time of ejection thereof and hence the solution forming the droplets were relatively easily brought into the supersaturated state immediately after being arranged on the substrate, but also the similar action as obtained in Embodiment 2-1. Also, presumably, the crystal growth was accelerated because of the similar action as obtained in Embodiment 2-1.

Embodiment 2-3

A solution D was prepared by dissolving Alq3 (quinolinol-aluminium complex, thin film forming material) having the structure represented by the above-mentioned chemical formula (7) in 2,3-dihydrobenzofuran (solvent) at a concentration of 2.0 weight %. The saturated concentration of Alq3 with respect to 2,3-dihydrobenzofuran at 25° C. (temperature at the time of ejection of the solution) is 1.0 weight %. In this solution D, therefore, Alq3 was brought into a supersaturated state at the time of ejection of the solution.

Exactly the same process as that in Embodiment 2-1 was carried out except for using the solution D. As a result, on the silicon substrate taken out of the enclosed container 1 after 6 hours, a thin film of Alq3 with a thickness of 0.1 μm in an acicular shape having a length of 30 μm was formed substantially in a single crystal condition at each of the positions where the droplets had been formed. The single-crystal thin film of Alq3 is a functional thin film suitably usable as, e.g., a light emitting layer of an organic EL device.

In this embodiment, a small number of nuclei were presumably formed because of not only that the solution was brought into the saturated state at the time of ejection thereof and hence the solution forming the droplets were relatively easily brought into the supersaturated state immediately after being arranged on the substrate, but also the similar action as obtained in Embodiment 2-1. Also, presumably, the crystal growth was accelerated because of the similar action as obtained in Embodiment 2-1.

Embodiment 2-4

A solution E was prepared by dissolving 4-amino-p-terphenyl (derivative of terpheniyl, thin film forming material) having the structure represented by the above-mentioned chemical formula (5) in dimethylformamide (solvent) at a concentration of 1.0 weight %. The saturated concentration of 4-amino-p-terphenyl with respect to dimethylformamide at 25° C. (temperature at the time of ejection of the solution) is 1.0 weight %. In this solution E, therefore, 4-amino-p-terphenyl was brought into a saturated state at the time of ejection of the solution.

Exactly the same process as that in Embodiment 2-1 was carried out except for using the solution E. As a result, on the silicon substrate taken out of the enclosed container 1 after 6 hours, a thin film (thickness of 0.5 mm) of 4-amino-p-terphenyl in a nearly rectangular shape of 10 μm×5 μm was formed substantially in a single crystal condition at each of the positions where the droplets had been formed. The crystalline thin film of 4-amino-p-terphenyl is a functional thin film suitably usable as a semiconductor film for various kinds of electronic devices.

In this embodiment, a small number of nuclei were presumably formed because of not only that the solution was brought into the saturated state at the time of ejection thereof and hence the solution forming the droplets were relatively easily brought into the supersaturated state immediately after being arranged on the substrate, but also the similar action as obtained in Embodiment 2-1. Also, presumably, the crystal growth was accelerated because of the similar action as obtained in Embodiment 2-1.

Embodiment 2-5

A solution F was prepared by dissolving 2,2':5',2"-terthiophene-5,5"-dicarboxyaldehyde (derivative of terthiophene, thin film forming material) having the structure represented by the above-mentioned chemical formula (6) in dimethylformamide (solvent) at a concentration of 1.0 weight %. The saturated concentration of the derivative with respect to dimethylformamide at 25° C. (temperature at the time of ejection of the solution) is 1.0 weight %. In this solution F, therefore, the derivative was brought into a saturated state at the time of ejection of the solution.

Exactly the same process as that in Embodiment 2-1 was carried out except for using the solution F. As a result, on the silicon substrate taken out of the enclosed container 1 after 6 hours, a thin film (thickness of 0.5 mm) of 2,2':5',2"-terthiophene-5,5"-dicarboxyaldehyde in a nearly rectangular shape of 10 μm×5 μm was formed substantially in a single crystal condition at each of the positions where the droplets had been formed. The crystalline thin film of 2,2':5',2"-terthiophene-5,5"-dicarboxyaldehyde is a functional thin film suitably usable as a semiconductor film for various kinds of electronic devices.

In this embodiment, a small number of nuclei were presumably formed because of not only that the solution was brought into the saturated state at the time of ejection thereof and hence the solution forming the droplets were relatively easily brought into the supersaturated state immediately after being arranged on the substrate, but also the similar action as obtained in Embodiment 2-1. Also, presumably, the crystal growth was accelerated because of the similar action as obtained in Embodiment 2-1.

In each of the above-described embodiments, by starting to reduce the pressure in the enclosed space at the same time as finishing the step of forming the droplets, the first partial pressure is quickly lowered to the second partial pressure to quickly increase the degree of supersaturation of the solution forming the droplets so that a crystalline thin film of a single crystal is obtained. However, the timing of starting the depressurization is not limited to the same timing as finishing the step of forming the droplets, and the depressurization may be started at any suitable timing depending on other conditions, etc.

Embodiment 3-1

First, a solution was prepared by dissolving p-terphenyl (thin film forming material) having the structure represented by the above-mentioned chemical formula (3) in 2,3-dihydrobenzofuran (solvent) at a concentration of 0.1 weight %. Also, ultraviolet rays were irradiated to a surface of a silicon substrate so that the surface became lyophilic (namely the surface had a property easily wettable with the solution).

Note that 2,3-dihydrobenzofuran is a poor solvent with respect to p-terphenyl. Also, the saturated concentration of p-terphenyl with respect to 2,3-dihydrobenzofuran at 25° C. (temperature at the time of ejection of the solution) is 1.0 weight %. Therefore, the concentration of p-terphenyl in the solution was 1/10 of the saturated concentration at the time of ejection of the solution.

Then, a thin film was formed on the silicon substrate using the thin film forming apparatus shown in FIG. 1. The thin film forming apparatus includes an enclosed container 1, an X-Y stage 2 mounted in the enclosed container 1, a head 3 of an ink jet device, and a pump 6 and a pipe 7 for reducing the pressure in the enclosed container 1.

The head 3 is fixed to a top portion of the enclosed container 1, and the solution is supplied to the head 3 from the outside. The head 3 and the X-Y stage 2 are disposed in positions facing each other. The pipe 7 for the pump 6 is connected to a bottom portion of the enclosed container 1.

First, the silicon substrate treated as described above was placed on the X-Y stage 2 of the apparatus, and the enclosed container 1 was airtightly closed. Then, the inner space of the enclosed container 1 was held at 25° C., and the solution was ejected from the head 3 onto the substrate surface in amount of 20 picoliter per droplet. The ejection of the solution was repeated 10 times while moving the X-Y stage 2 along one side of the substrate in units of 210 μm. The distance between the head nozzle and the substrate was set to 1 μm. As a result, 10 droplets were formed at pitch of 210 μm along one straight line on the substrate.

At the same time as finishing the above step of forming the droplets, operation of the depressurizing pump 6 was started to reduce the pressure in the enclosed container 1 to 1.3 Pa (10-2 torr), and this depressurized state was held for 6 hours. On the silicon substrate taken out of the enclosed container 1 after 6 hours, a thin film (thickness of 0.5 mm) of p-terphenyl in a nearly rhombus shape having each side of 20 μm to 30 μm was formed substantially in a single crystal condition at each of the positions where the droplets had been formed. The crystalline thin film of p-terphenyl is a functional thin film suitably usable as a semiconductor film for various kinds of electronic devices.

In this embodiment, since the concentration of the solution at the time of ejection thereof was 1/10 of the saturated concentration, the solution forming the droplets were relatively easily brought into a supersaturated state immediately after being arranged on the substrate. Also, by forming the droplets at pitch of 210 μm with the amount of the ejected solution per droplet set to 20 picoliter, the partial pressure of a gas of 2,3-dihydrobenzofuran (i.e., the same components as those of the solvent) in the vicinity of the droplets immediately after being arranged was held at a high partial pressure under which 2,3-dihydrobenzofuran (solvent) was hard to evaporate from the solution in the form of the droplets. Presumably, in those situations, the solution in the form of the droplets was stabilized in the supersaturated state at a relatively low degree of supersaturation and a small number of nuclei were formed.

Furthermore, presumably, by starting to reduce the pressure in the enclosed space (enclosed container 1) at the same time as finishing the step of forming the droplets, the partial pressure of solvent vapors in the vicinity of the droplets were quickly lowered in the stage in which a small number of nuclei were formed, and the degree of supersaturation of the solution in the form of the droplets was quickly increased, thus leading to a state in which growth of the crystalline nuclei into crystals occurred with priority to creation of further crystalline nuclei. Then, the crystal growth was accelerated by holding such a depressurized state for 6 hours.

Embodiment 3-2

A solution C was prepared by dissolving terthiophene (2,2':5',2''-terthiophene, thin film forming material) having the structure represented by the above-mentioned chemical formula (4) in dodecylbenzene (solvent) at a concentration of 1.0 weight %. Dodecylbenzene is a poor solvent with respect to terthiophene. Also, the saturation concentration of terthiophene with respect to dodecylbenzene at 25° C. (temperature at the time of ejection of the solution) is 1.0 weight %. In this solution C, therefore, terthiophene was brought into a saturated state at the time of ejection of the solution.

A solution G was prepared by dissolving terthiophene (thin film forming material) having the structure represented by the above-mentioned chemical formula (2) in 2,3-dihydrobenzofuran (solvent) at a concentration of 20.0 weight %. 2,3-Dihydrobenzofuran is a good solvent with respect to terthiophene. Also, the saturated concentration of terthiophene with respect to 2,3-dihydrobenzofuran at 25° C. (temperature at the time of ejection of the solution) is 20.0 weight %. In this solution G, therefore, terthiophene was brought into a saturated state at the time of ejection of the solution.

Exactly the same process as that in Embodiment 3-1 was carried out except for using the solutions C and G. As a result, in the case using the solution C, on the silicon substrate taken out of the enclosed container 1 after 6 hours, a thin film (thickness of 0.5 mm) of terthiophene in a nearly rectangular shape of 10 μm×5 μm was formed substantially in a single crystal condition at each of the positions where the droplets had been formed. The crystalline thin film of terthiophene is a functional thin film suitably usable as a semiconductor film for various kinds of electronic devices.

On the other hand, in the case using the solution G, a gel-like film similar to a high-molecular film was formed on the silicon substrate taken out of the enclosed space after 6 hours.

Embodiment 3-3

A solution was prepared by dissolving 4-amino-p-terphenyl (derivative of terpheniyl, thin film forming material) having the structure represented by the above-mentioned chemical formula (5) in dimethylformamide (solvent) at a concentration of 1.0 weight %. Dimethylformamide is poor solvent with respect to 4-amino-p-terphenyl. Also, the saturated concentration of 4-amino-p-terphenyl with respect to dimethylformamide at 25° C. (temperature at the time of ejection of the solution) is 1.0 weight %. In this solution, therefore, 4-amino-p-terphenyl was brought into a saturated state at the time of ejection of the solution.

Exactly the same process as that in Embodiment 3-1 was carried out except for using the solution thus prepared. As a result, on the silicon substrate taken out of the enclosed container 1 after 6 hours, a thin film (thickness of 0.5 mm) of 4-amino-p-terphenyl in a nearly rectangular shape of 10 μm×5 μm was formed substantially in a single crystal condition at each of the positions where the droplets had been formed. The crystalline thin film of 4-amino-p-terphenyl is a functional thin film suitably usable as a semiconductor film for various kinds of electronic devices.

Embodiment 3-4

A solution was prepared by dissolving 2,2':5',2''-terthiophene-5,5''-dicarboxyaldehyde (derivative of terthiophene, thin film forming material) having the structure represented by the above-mentioned chemical formula (6) in dimethylformamide (solvent) at a concentration of 1.0 weight %. Dimethylformamide is a poor solvent with respect to the derivative (2,2':5',2''-terthiophene-5,5''-dicarboxyaldehyde). Also, the saturation concentration of the derivative with respect to dimethylformamide at 25° C. (temperature at the time of ejection of the solution) is 1.0 weight %. In this solution, therefore, the derivative was brought into a saturated state at the time of ejection of the solution.

Exactly the same process as that in Embodiment 3-1 was carried out except for using the solution thus prepared. As a result, on the silicon substrate taken out of the enclosed container 1 after 6 hours, a thin film (thickness of 0.5 mm) of 2,2':5',2''-terthiophene-5,5''-dicarboxyaldehyde in a nearly rectangular shape of 10 μm×5 μm was formed substantially in a single crystal condition at each of the positions where the droplets had been formed. The crystalline thin film of 2,2':5',2''-terthiophene-5,5''-dicarboxyaldehyde is a functional thin film suitably usable as a semiconductor film for various kinds of electronic devices.

Embodiment 4-1

In this embodiment, a description is made of a method of forming a p-terphenyl thin film by the ink jet method using a 2,3-dihydrobenzofuran solution of p-terphenyl (thin film forming material) having the structure represented by the above-mentioned chemical formula (3). FIGS. 4(a) to 4(f)

are sectional views showing successive steps carried out in accordance with the method of this embodiment.

Figure 4:
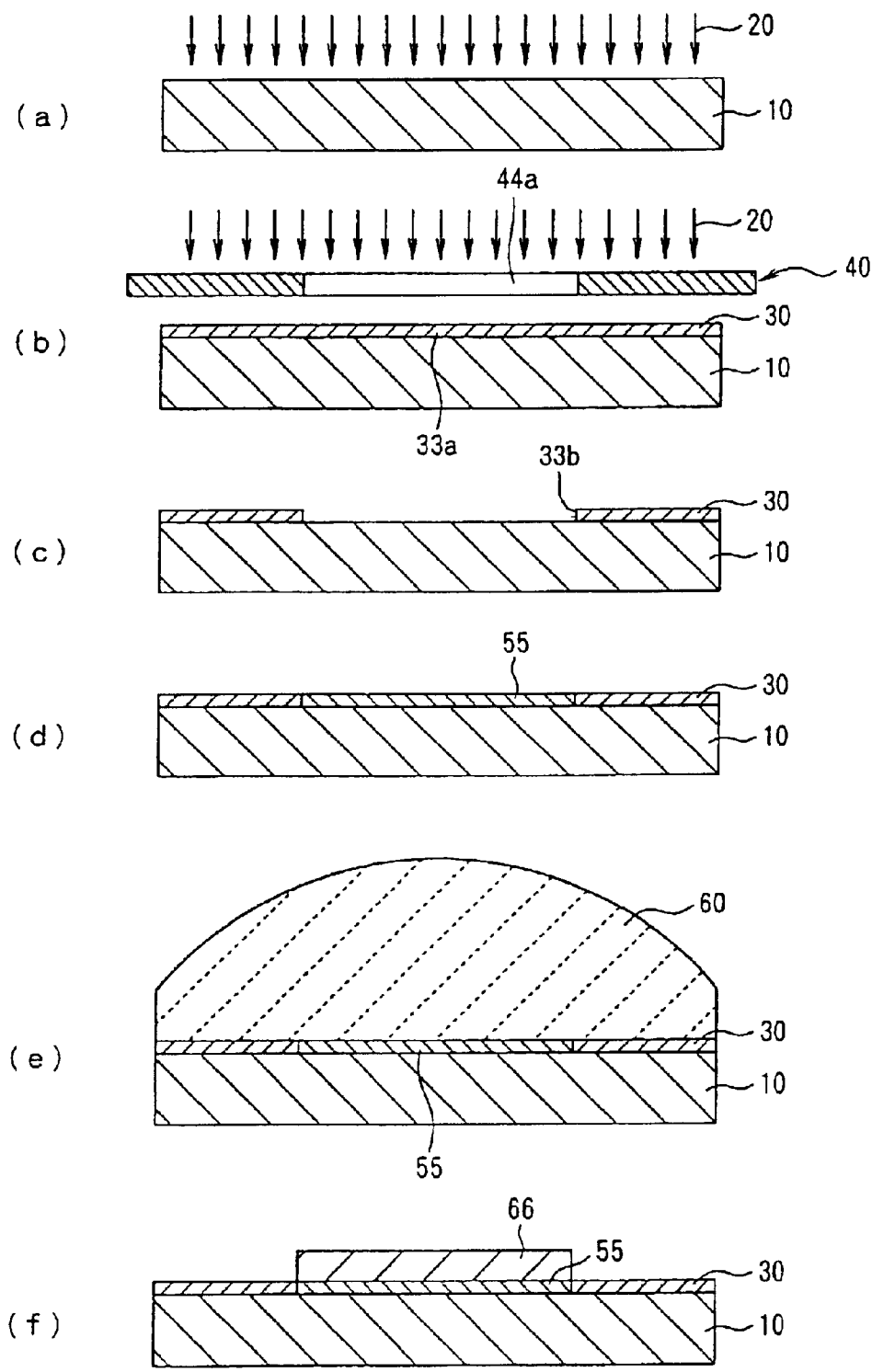
FIGS. 4(a) to 4(f) are sectional views explaining successive steps executed in Embodiments 4-1 to 4-4 of the present invention.

First, a shown in FIG. 4(a), ultraviolet rays 20 with a wavelength of 172 nm were irradiated to a surface of a silicon substrate 10 so that the surface of the silicon substrate 10 became hydrophilic.

[Chemical Formula 8] (8)

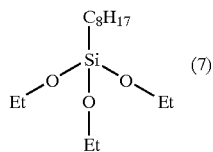

Then, a liquid of octyltriethoxysilane represented by the above formula (8) was put in a container having no cap. That container and the silicon substrate 10 were both placed in an enclosed space and held to stand as they were for 1 hour while keeping temperature in the enclosed space at 120° C.

As a result, hydroxyl radicals present on the surface of the silicon substrate 10 and ethoxy radicals of octyltriethoxysilane reacted with each other to develop coupling between oxygen atoms of the ethoxy radicals and the silicon substrate 10. A self-assembly film (second self-assembly film made up of molecules each having no atomic group common to molecules constituting p-terphenyl) 30 having the octyl radicals on its surface was thereby formed on the entire surface of the silicon substrate 10.

Then, as shown in FIG. 4(b), ultraviolet rays with a wavelength of 172 nm were irradiated to the second self-assembly film 30 through a photomask 40 having a light transmitting portion 44a formed corresponding to a thin film formed area (defined by a pattern consisting of numerous circles each having a diameter of 20 μm and arrayed at pitch of 210 mm). With irradiation of the ultraviolet rays, a portion 33a of the second self-assembly film 30 corresponding to the thin film formed area was decomposed.

Then, the portion 33a of the second self-assembly film 30 was removed by washing the silicon substrate 10 with ethanol. With the above step, as shown in FIG. 4(c), a circular opening 33b was formed in portion of the second self-assembly film 30 corresponding to the circular thin film formed area such that the substrate surface 33b was exposed in the opening 33b.

[Chemical Formula 9] (9)

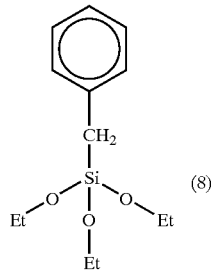

Then, a liquid of benzyltriethoxysilane represented by the above formula (9) was put in a container having no cap. That container and the silicon substrate 10 were both placed in an enclosed space and held to stand as they were for 1 hour while keeping temperature in the enclosed space at 120° C.

As a result, hydroxyl radicals present on the surface of the silicon substrate 10 exposed in the opening 33b and ethoxy radicals of benzyltriethoxysilane reacted with each other to develop coupling between oxygen atoms of the ethoxy radicals and the silicon substrate 10. A first self-assembly film (self-assembly film made up of molecules each having a benzene ring as an atomic group common to molecules constituting p-terphenyl) 55 having the benzyl radicals on its surface was thereby formed in the circular opening 33b of the second self-assembly film 30. In other words, a number of first self-assembly films 55 were formed in a pattern including numerous circles each having a diameter of 20 μm and arrayed at pitch of 210 μm.

Figure 5:
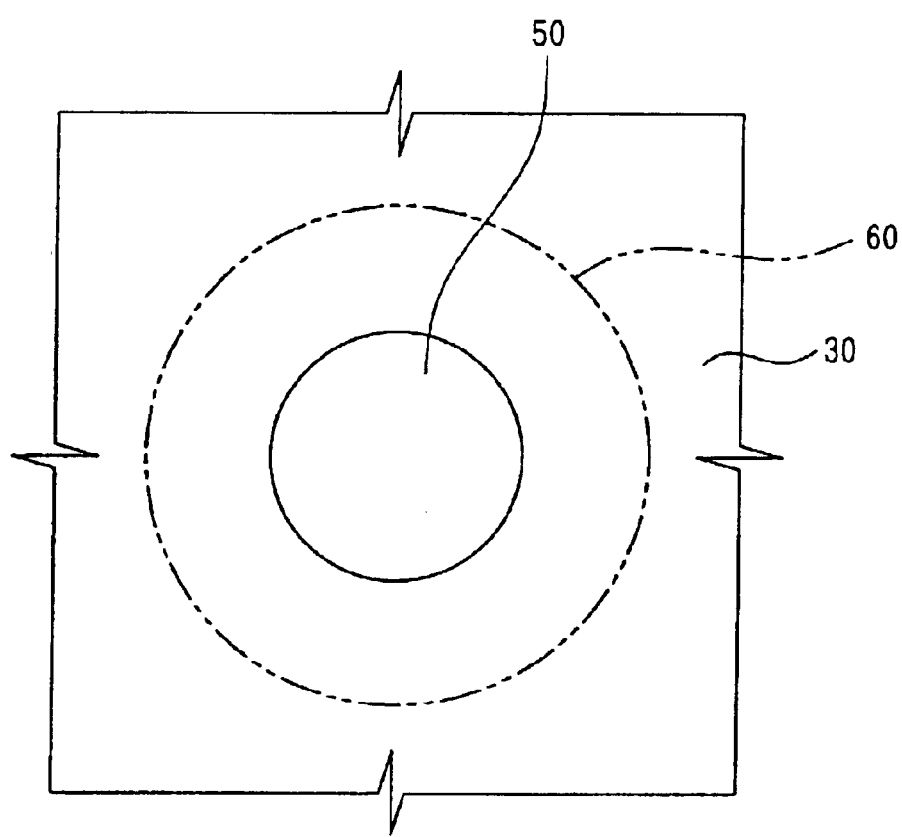
FIG. 5 is a plan view explaining states of FIGS. 4(d) and 4(e)

FIGS. 4(d) and 5 are respectively a sectional view and a plan view showing the above state. With the steps described above, as shown in FIGS. 4(d) and 5, a first area (area in which the first self-assembly film 55 was formed) 50 in a surface condition having a high affinity with p-terphenyl (thin film forming material) was formed in the pattern of small circles, and an area on the silicon substrate 10 other than the first area 50 was provided as a second area (area in which the second self-assembly film 30 was formed) 30 in a surface condition having a low affinity with p-terphenyl.

Then, a solution was prepared by dissolving p-terphenyl (thin film forming material) in 2,3-dihydrobenzofuran (solvent) at a concentration of 0.1 weight %. Subsequently, the silicon substrate 10 in the state shown in FIG. 4(d) was placed in an enclosed space associated with a depressurizing pump, and the enclosed space was held at 25° C. Using Ink Jet Device "MJ-930C" manufactured by Seiko Epson Corporation, the solution was ejected onto the substrate surface under the above condition in amount of 20 picoliter per droplet.

The saturated concentration of p-terphenyl with respect to 2,3-dihydrobenzofuran at 25° C. is 1.0 weight %. Therefore, the concentration of p-terphenyl in the solution was 1/10 of the saturated concentration at the time of ejection of the solution.

The head of the ink jet device employed here had a single nozzle. An atmosphere in the enclosed space was provided by air under the atmospheric pressure, and the ejection of the solution was repeated 10 times while moving the head along one side of the substrate in units of 210 μm.

The ejection of the solution was performed while the center of each circle of the first self-assembly films 55 was aligned with the position of the head nozzle. The distance between the head nozzle and the substrate was set to 1 μm.

As a result, ten droplets 60 of the solution were formed at pitch of 210 μm along one straight line on the silicon substrate 10. As indicated by a double dashed line in FIG. 5, each of the droplets 60 was arranged on the silicon substrate 10 such that it had a bottom surface in the form of a circle (40 mm) larger than the first area 50 of the first self-assembly films 55. In other words, the droplet 60 was formed in a state covering the entirety of the first area 50 and spreading up to a position above the second area 30. FIG. 4(e) shows such a condition.

At the same time as finishing the above step of forming the droplets, operation of the depressurizing pump was started to reduce the pressure in the enclosed space to 1.3 Pa (10-2 torr), and this depressurized state was held for 6 hours. On the silicon substrate 10 taken out of the enclosed space after 6 hours, as shown in FIG. 4(f), a thin film 66 (thickness of 0.5 mm) of p-terphenyl in a circular shape having a diameter of 20 μm was formed substantially in a single crystal condition only in portions of the silicon substrate 10 in which the first self-assembly films 55 had been formed.

Thus, a thin film of p-terphenyl was formed on the substrate in the same pattern as the first self-assembly films 55.

Incidentally, the single-crystal thin film of p-terphenyl is a functional thin film suitably usable as a semiconductor film for various kinds of electronic devices.

In this embodiment, since the concentration of the solution at the time of ejection thereof was 1/10 of the saturated concentration, the solution forming the droplets were relatively easily brought into a supersaturated state immediately after being arranged on the substrate. Also, by forming the droplets at pitch of 210 μm with the amount of the ejected solution per droplet set to 20 picoliter, the partial pressure of a gas of 2,3-dihydrobenzofuran (i.e., the same components as those of the solvent) in the vicinity of the droplets was held at a high partial pressure under which 2,3-dihydrobenzofuran (solvent) was hard to evaporate from the solution in the form of the droplets. Presumably, in those situations, the solution in the form of the droplets was stabilized in the supersaturated state at a relatively low degree of supersaturation and a small number of nuclei were formed.

Furthermore, presumably, by starting to reduce the pressure in the enclosed space at the same time as finishing the step of forming the droplets, the partial pressure of solvent vapors in the vicinity of the droplets were quickly lowered in the stage in which a small number of nuclei were formed, and the degree of supersaturation of the solution in the form of the droplets was quickly increased, thus leading to a state in which growth of the crystalline nuclei into crystals occurred with priority to creation of further crystalline nuclei. Then, the crystal growth was accelerated by holding such a depressurized state for 6 hours.

This embodiment employed p-terphenyl as the thin film forming material, 2,3-dihydrobenzofuran as the solvent, benzyltriethoxysilane to form the first self-assembly film for bringing the substrate into a surface condition being highly affinitive (having high affinity) with p-terphenyl, and octyltriethoxysilane to form the second self-assembly film for bringing the substrate into a surface condition being less affinitive (having low affinity) with p-terphenyl. However, benzyltriethoxysilane may be replaced with a compound obtained by replacing a benzene ring of benzyltriethoxysilane with a naphthalene ring, etc., or a compound in which a methylene radical is replaced with any other alkylene radical.

Embodiment 4-2

A solution was prepared by dissolving 4-amino-p-terphenyl (derivative of terpheniyl, thin film forming material) having the structure represented by the above-mentioned chemical formula (5) in dimethylformamide (solvent) at a concentration of 1.0 weight %. The saturated concentration of 4-amino-p-terphenyl with respect to dimethylformamide at 25° C. (temperature at the time of ejection of the solution) is 1.0 weight %. In this solution, therefore, 4-amino-p-terphenyl was brought into a saturated state at the time of ejection of the solution.

Exactly the same process as that in Embodiment 4-1 was carried out except for using the solution thus prepared. As a result, on the silicon substrate 10 taken out of the enclosed space after 6 hours, a thin film 66 (thickness of 0.1 mm) of 4-amino-p-terphenyl in a circular shape having a diameter of 20 μm was formed substantially in a single crystal condition, as shown in FIG. 4(f), only in each of the portions of the silicon substrate 10 where the first self-assembly films 55 had been formed. In other words, a thin film of 4-amino-p-terphenyl was formed on the substrate in the same pattern as the first self-assembly films 55. The crystalline thin film of 4-amino-p-terphenyl is a functional thin film suitably usable as a semiconductor film for various kinds of electronic devices.

Embodiment 4-3

A solution was prepared by dissolving terthiophene (2,2':5',2"-terthiophene, thin film forming material) having the structure represented by the above-mentioned chemical formula (4) in dodecylbenzene (solvent) at a concentration of 1.0 weight %. The saturated concentration of terthiophene with respect to dodecylbenzene at 25° C. (temperature at the time of ejection of the solution) is 1.0 weight %. In this solution, therefore, terthiophene was brought into a saturated state at the time of ejection of the solution.

Exactly the same process as that in Embodiment 4-1 was carried out except for that a substrate having gold in its surface and, when forming the first self-assembly films 55, a liquid of 2,2':5',2":5",2"'-quarterthiophene-5",5"'-diylbis-(phosphonic acid) represented by the following chemical formula (10) was employed instead of benzyltriethoxysilane.

(10)

[Chemical Formula 10]

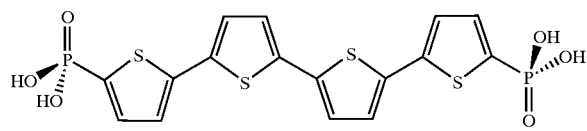

As a result, on the silicon substrate 10 taken out of the enclosed space after 6 hours, a thin film 66 (thickness of 0.1 mm) of terthiophene in a circular shape having a diameter of 20 μm was formed substantially in a single crystal condition, as shown in FIG. 4(f), only in each of the portions of the silicon substrate 10 where the first self-assembly films 55 had been formed. In other words, a thin film of terthiophene was formed on the substrate in the same pattern as the first self-assembly films 55. The crystalline thin film of terthiophene is a functional thin film suitably usable as a semiconductor film for various kinds of electronic devices. Also, a single-crystal thin film of oligothiophene is suitably usable as a functional thin film constituting an organic TFT (thin film transistor).

Embodiment 4-4

A solution was prepared by dissolving 2,2':5',2"-terthiophene-5,5"-dicarboxyaldehyde (derivative of terthiophene, thin film forming material) having the structure represented by the above-mentioned chemical formula (6) in dimethylformamide (solvent) at a concentration of 1.0 weight %. The saturated concentration of the derivative with respect to dimethylformamide at 25° C. (temperature at the time of ejection of the solution) is 1.0 weight %. In this solution, therefore, the derivative was brought into a saturated state at the time of ejection of the solution.

Exactly the same process as that in Embodiment 4-3 was carried out except for using the solution thus prepared.

As a result, on the silicon substrate 10 taken out of the enclosed space after 6 hours, a thin film 66 (thickness of 0.1 mm) of 2,2':5',2"-terthiophene-5,5"-dicarboxyaldehyde in a circular shape having a diameter of 20 μm was formed substantially in a single crystal condition, as shown in FIG. 4(f), only in each of the portions of the silicon substrate 10 where the first self-assembly films 55 had been formed. In other words, a thin film of 2,2':5',2"-terthiophene-5,5"-dicarboxyaldehyde was formed on the substrate in the same pattern as the first self-assembly films 55. The crystalline thin film of 2,2':5',2"-terthiophene-5,5"-dicarboxyaldehyde is a functional thin film suitably usable as a semiconductor film for various kinds of electronic devices.

Embodiment 5-1

A solution was prepared by dissolving Alq3 (quinolinol-aluminium complex, thin film forming material) having the structure represented by the above-mentioned chemical formula (7) in 2,3-dihydrobenzofuran (solvent) at a concentration of 0.1 weight %.

Also, ultraviolet rays with a wavelength of 172 nm were irradiated to the surface of the silicon substrate so that the surface of the silicon substrate became lyophilic (namely the substrate surface had a property easily wettable with the solution). Further, a spin coater and an ink jet device were prepared and a head of the ink jet device was disposed above the spin coater.

On the surface of the silicon substrate thus treated to be lyophilic, the solvent of the prepared solution, i.e., 2,3-dihydrobenzofuran, was coated by spin coating. For a sample No. 1, operation of the spin coater was started immediately after 2,3-dihydrobenzofuran was dripped onto the substrate surface from a dispenser, such that the rotational speed reached 2000 rpm after 2 seconds. After rotating the spin coater at that rotational speed for 30 seconds, the spin coater was deenergized to stop the rotation in 2 seconds.

Then, at the same time as stopping of the rotation of the spin coater, ejection of the solution was started from the head using the ink jet method. The head of the ink jet device employed here had a single nozzle.

The ejection of the solution was repeated 10 times on condition that the distance between the head nozzle and the substrate was set to 1 $\mu$m and the amount of the ejected solution per droplet was set to 20 picoliter, while moving the head along one side of the substrate in units of 210 $\mu$m. As a result, 10 droplets of the solution were formed at pitch of 210 $\mu$m along one straight line on the silicon substrate. Subsequently, another 10 droplets were formed at pitch of 210 $\mu$m along another straight line spaced 210 $\mu$m from the above straight line in parallel. By repeating the above step ten times, droplets of 10 columns×10 rows were formed on the silicon substrate at pitch of 210 $\mu$m.

Then, the substrate was left to stand in the above condition, causing the solvent to evaporate from the solution for natural drying.

For a sample No. 2, the solvent was coated exactly in the same manner as that for the sample No. 1 except to set the rotation time at 2000 rpm to 60 seconds. Thereafter, the droplets were formed in the same manner as that for the sample No. 1.

For a sample No. 3, the droplets were formed in the same manner as that for the sample No. 1 without coating the solvent.

In the case coating the solvent under the conditions for the sample No. 1, it was visually confirmed that a small amount of the solvent was left on the substrate surface on which the solvent had been coated. Also, the formed droplets had larger sizes than those in the sample No. 3 in which the droplets were formed on the substrate surface not covered with the solvent. Further, it was confirmed that all the droplets were kept remain in positions where they had been formed, without displacing from the respective positions. Then, after evaporation of the solvent, a thin film of Alq3 was formed in each of the positions where the droplets had been formed. Incidentally, the thin film of Alq3 was not a crystalline thin film, but an amorphous thin film.

In the case coating the solvent under the conditions for the sample No. 2, it visually seemed that no solvent was left on the substrate surface on which the solvent had been coated, and the substrate surface was in a completely dried state. Also, it was confirmed that all the droplets were kept remain in positions where they had been formed, without displacing from the respective positions. Then, after evaporation of the solvent, a thin film of Alq3 was formed in each of the positions where the droplets had been formed. Incidentally, the thin film of Alq3 was not a crystalline thin film, but an amorphous thin film.

For the sample No. 3 in which the solvent was not coated, it was confirmed that, of the droplets of 10 columns×10 rows, the droplets in all the rows at the first column, all the rows at the tenth column, and the first and tenth rows at the second to ninth columns were all displaced. In other words, the droplets positioned at an outer periphery were all displaced.

Embodiment 5-2

First, a silicon substrate having been treated to be lyophilic similarly to Embodiment 5-1 was dipped in a container filled with 2,3-dihydrobenzofuran for 30 seconds and then taken out of the container. In other words, a solvent was coated on a silicon substrate by dipping.

Then, the coated substrate was placed below a head of an ink jet device. A nitrogen gas was sprayed over an entire upper surface of the substrate for 30 seconds so that the entire upper surface of the substrate was dried. Immediately after that, the solution was ejected through the head by the ink jet method in the same manner as that in Embodiment 5-1. As a result, droplets of 10 columns×10 rows were formed on the silicon substrate at pitch of 210 $\mu$m.

The droplets formed in this embodiment had larger sizes than those in the case forming the droplets on the substrate surface on which the solvent had not been coated. Further, it was confirmed that all the droplets were kept remain in positions where they had been formed, without displacing from the respective positions. Then, after evaporation of the solvent, a thin film of Alq3 was formed in each of the positions where the droplets had been formed. Incidentally, the thin film of Alq3 was not a crystalline thin film, but an amorphous thin film.

Embodiment 5-3

First, 2,3-dihydrobenzofuran was coated by the ink jet method on a silicon substrate which has been treated to be lyophilic similarly to Embodiment 5-1. The coating was performed such that droplets of the solvent were arranged in an array of 10 columns×10 rows over the entire substrate surface at pitch of 210 $\mu$m in positions where droplets of the solution are to be formed.

Then, at the same time as it was visually confirmed that all the solvent droplets were dried, the solution was ejected by the ink jet method in the same manner as that in Embodiment 5-1. As a result, the droplets of the solution were formed in an array of 10 columns×10 rows on the silicon substrate at pitch of 210 $\mu$m.

It was confirmed that all the solution droplets formed in this embodiment were kept remain in positions where they had been formed, without displacing from the respective positions. Then, after evaporation of the solvent, a thin film of Alq3 was formed in each of the positions where the droplets had been formed. Incidentally, the thin film of Alq3 was not a crystalline thin film, but an amorphous thin film.

Embodiment 5-4

First, 2,3-dihydrobenzofuran was coated by the ink jet method on a silicon substrate which has been treated to be lyophilic similarly to Embodiment 5-1. The coating was performed such that droplets of the solvent were arranged in an array of 11 columns×11 rows on the substrate surface at pitch of 210 μm in positions where droplets of the solution are not to be formed.

Then, at the same time as it was visually confirmed that all the solvent droplets were dried, the solution was ejected by the ink jet method in the same manner as that in Embodiment 5-1. As a result, the droplets of the solution were formed in an array of 11 columns×11 rows on the silicon substrate at pitch of 210 pm.

Figure 6:
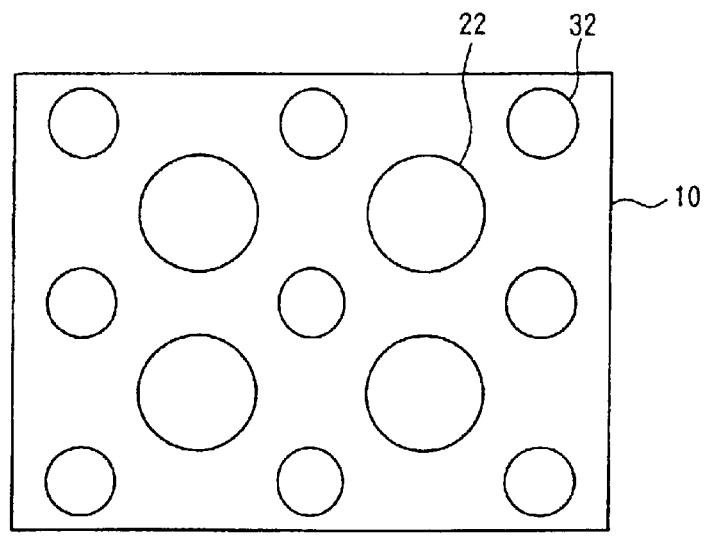
FIG. 6 is a plan view showing the positional relationship between droplets of a solution and droplets of a solvent, which are arranged in Embodiment 5-4.

FIG. 6 is a plan view showing the positional relationship between the droplets of the solution and the droplets of the solvent, which are arranged in this embodiment. In this embodiment, as shown in FIG. 6, solvent droplets 32 were arranged on the silicon substrate 10 in which solution droplets 22 were not formed.

It was confirmed that all the solution droplets formed in this embodiment were kept remain in positions where they had been formed, without displacing from the respective positions. Then, after evaporation of the solvent, a thin film of Alq3 was formed in each of the positions where the droplets had been formed. Incidentally, the thin film of Alq3 was not a crystalline thin film, but an amorphous thin film.

Embodiment 5-5

Figure 7:
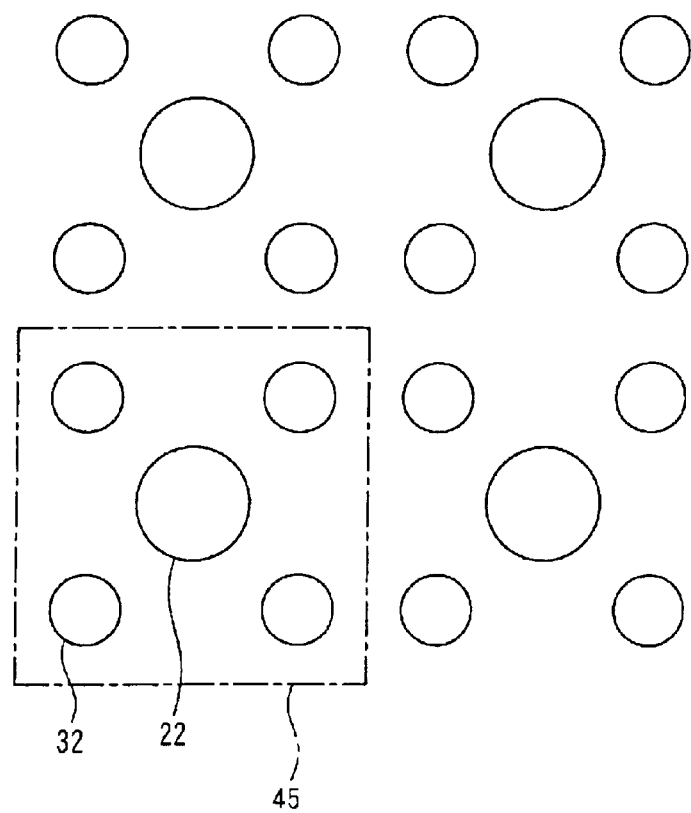
FIG. 7 is a plan view showing the positional relationship between droplets of a solution and droplets of a solvent, which are arranged in Embodiment 5-5.

On a surface of a silicon substrate which has been treated to be lyophilic similarly to Embodiment 5-1, droplets 22 of the solution (i.e., a solution of Alq3 dissolved in 2,3-dihydrobenzofuran at a concentration of 0.1 weight %) and droplets 32 of the solvent (2,3-dihydrobenzofuran) were formed by the ink jet method in an array shown in FIG. 7.

More specifically, assuming a square 45 indicated by one-dot-chain lines in FIG. 7 to be one unit, a step of forming the solution droplets 22 and the solvent droplets 32 at the same time for each unit was repeated to form the solution droplets 22 in an array of 3 columns×10 rows on the silicon substrate at pitch of 210 μm. To that end, an ink jet device was prepared which comprised a head including one nozzle for the solution and four nozzles for solvent, these nozzles being arranged in the square 45 as shown in FIG. 7, and a liquid supply device to supply the solution and the solvent to the corresponding nozzles of the head. The solution and the solvent were ejected for each of the above-mentioned unit using the prepared ink jet device.

Also, in this embodiment, the solution and the solvent were ejected such that, for each of the above-mentioned unit, one solution droplet 22 was arranged at the center of the square 45 and four solvent droplets 32 were arranged in positions on diagonal lines of the square 45 spaced the same length from the center. Accordingly, the solvent droplets 32 were evenly arranged around the solution droplet 22 on the substrate.

It was confirmed that all the solution droplets 22 formed in this embodiment were kept remain in positions where they had been formed, without displacing from the respective positions. Then, after evaporation of the solvent, a thin film of Alq3 was formed in each of the positions where the droplets had been formed. Furthermore, the thin films formed in the respective positions were even in film thickness and surface condition. Incidentally, the thin film of Alq3 was not a crystalline thin film, but an amorphous thin film.

Embodiment 5-6

First, the solution droplets 22 and the solvent droplets 32 were formed on the silicon substrate in an enclosed space associated with a depressurizing pump by the ink jet method in the same manner as that in Embodiment 5-5 while holding the enclosed space at 25° C. Note that the saturation concentration of Alq3 with respect to 2,3-dihydrobenzofuran at 25° C. is 1.0 weight %. Therefore, the concentration of Alq3 in the solution was 1/10 of the saturation concentration at the time of ejection of the solution.

At the same time as finishing the above step of forming the droplets, operation of the depressurizing pump was started to reduce the pressure in the enclosed space to 1.3 Pa (10-2 torr), and this depressurized state was held for 6 hours. On the silicon substrate 10 taken out of the enclosed space after 6 hours, a thin film of Alq3 with a thickness of 0.1 μm in an needlelike shape having a length of 30 μm was formed substantially in a single crystal condition at each of the positions where the droplets had been formed. The single-crystal thin film of Alq3 is a functional thin film suitably usable as, e.g., a light emitting layer of an organic EL device.

In this embodiment, since the concentration of the solution at the time of ejection thereof was 1/10 of the saturation concentration, the solution forming the droplets were relatively easily brought into a supersaturated state immediately after being arranged on the substrate. Also, by forming the droplets at pitch of 210 μm with the amount of the ejected solution per droplet set to 20 picoliter, the partial pressure of a gas of 2,3-dihydrobenzofuran (i.e., the same components as those of the solvent) in the vicinity of the droplets was held at a high partial pressure under which 2,3-dihydrobenzofuran (solvent) was hard to evaporate from the solution in the form of the droplets. Further, as shown in FIG. 7, since the solvent droplets 32 were evenly simultaneously arranged on the substrate around the solution droplets 22, the partial pressure of the gas around the droplets was brought into an even high level immediately after arranging the droplets. Presumably, in those situations, the solution in the form of the droplets was stabilized in the supersaturated state at a relatively low degree of supersaturation and a small number of nuclei were formed.

Furthermore, presumably, by starting to reduce the pressure in the enclosed space at the same time as finishing the step of forming the droplets, the partial pressure of solvent vapors in the vicinity of the droplets were quickly lowered in the stage in which a small number of nuclei were formed, and the degree of supersaturation of the solution in the form of the droplets was quickly increased, thus leading to a state in which growth of the crystalline nuclei into crystals occurred with priority to creation of further crystalline nuclei. Then, the crystal growth was accelerated by holding such a depressurized state for 6 hours.

Moreover, it is thought that since the partial pressure of the gas around the droplets was brought into an even high level immediately after arranging the droplets as described above, all the formed droplets were kept remain in the positions where they had been formed, without displacing from the respective positions, and crystalline thin films were formed in the positions (predetermined positions) on the substrate where the droplets were to be formed.

In addition, the reason why an amorphous thin film was obtained instead of a crystalline thin film is presumably attributable to that the droplets were naturally dried in Embodiment 5-5 although a small number of nuclei were also formed in Embodiment 5-5 because the process up to the step of arranging the droplet was the same in Embodiment 5-5 as well. And this phenomenon occurs in the above embodiments 5-1–5-4.

Embodiment 5-7

A solution was prepared by dissolving 4-amino-p-terphenyl (derivative of terphenyl, thin film forming material) having the structure represented by the above-mentioned chemical formula (5) in dimethylformamide (solvent) at a concentration of 1.0 weight %. The saturation concentration of 4-amino-p-terphenyl with respect to dimethylformamide at 25° C. (temperature at the time of ejection of the solution) is 1.0 weight %. In this solution, therefore, 4-amino-p-terphenyl was brought into a saturated state at the time of ejection of the solution.

Droplets were formed exactly in the same manner as that in Embodiment 5-6 except for using the solution thus prepared. More specifically, the solution droplets 22 and the solvent droplets 32 were first formed on the silicon substrate in an enclosed space associated with a depressurizing pump by the ink jet method in the same manner as that in Embodiment 5-5 while holding the enclosed space at 25° C.

At the same time as finishing the above step of forming the droplets, operation of the depressurizing pump was started to reduce the pressure in the enclosed space to 1.3 Pa (10-2 torr), and this depressurized state was held for 6 hours. On the silicon substrate 10 taken out of the enclosed space after 6 hours, a thin film (thickness of 50 mm) of 4-amino-p-terphenyl in a nearly rectangular shape of 20 $\mu$m×30 $\mu$m was formed substantially in a single crystal condition at each of the positions where the droplets had been formed. The crystalline thin film of 4-amino-p-terphenyl is a functional thin film suitably usable as a semiconductor film for various kinds of electronic devices.

In this embodiment, a small number of nuclei were presumably formed because of not only that the solution was brought into the saturated state at the time of ejection thereof and hence the solution forming the droplets were relatively easily brought into the supersaturated state immediately after being arranged on the substrate, but also the similar action as obtained in Embodiment 5-6. Also, presumably, the crystal growth was accelerated because of the similar action as obtained in Embodiment 5-6. Further, as with Embodiment 5-6, since the partial pressure of the gas around the droplets was brought into an even high level immediately after arranging the droplets, all the formed droplets were kept in the positions where they had been formed, without displacing from the respective positions, and crystalline thin films were formed in the positions (predetermined positions) on the substrate where the droplets were to be formed.

Embodiment 5-8

A solution was prepared by dissolving 2,2':5',2"-terthiophene-5,5"-dicarboxyaldehyde (derivative of terthiophene, thin film forming material) having the structure represented by the above-mentioned chemical formula (6) in dimethylformamide (solvent) at a concentration of 1.0 weight %. The saturation concentration of the derivative with respect to dimethylformamide at 25° C. (temperature at the time of ejection of the solution) is 1.0 weight %. In this solution, therefore, the derivative was brought into a saturated state at the time of ejection of the solution.

Droplets were formed exactly in the same manner as that in Embodiment 5-6 except to use the solution thus prepared. More specifically, the solution droplets 22 and the solvent droplets 32 were first formed on the silicon substrate in an enclosed space associated with a depressurizing pump by the ink jet method in the same manner as that in Embodiment 5-5 while holding the enclosed space at 25° C.

At the same time as finishing the above step of forming the droplets, operation of the depressurizing pump 6 was started to reduce the pressure in the enclosed space to 1.3 Pa (10-2 torr), and this depressurized state was held for 6 hours. On the silicon substrate 10 taken out of the enclosed space after 6 hours, a thin film (thickness of 50 mm) of 2,2':5',2"-terthiophene-5,5"-dicarboxyaldehyde in a nearly rectangular shape of 20 $\mu$m×30 $\mu$m was formed substantially in a single crystal condition at each of the positions where the droplets had been formed. The crystalline thin film of 2,2':5',2"-terthiophene-5,5"-dicarboxyaldehyde is a functional thin film suitably usable as a semiconductor film for various kinds of electronic devices.

In this embodiment, a small number of nuclei were presumably formed because of not only that the solution was brought into the saturated state at the time of ejection thereof and hence the solution forming the droplets were relatively easily brought into the supersaturated state immediately after being arranged on the substrate, but also the similar action as obtained in Embodiment 5-6. Also, presumably, the crystal growth was accelerated because of the similar action as obtained in Embodiment 5-6. Further, it is thought as with Embodiment 5-6 that since the partial pressure of the gas around the droplets was brought into an even high level immediately after arranging the droplets, all the formed droplets were kept in the positions where they had been formed, without displacing from the respective positions, and crystalline thin films were formed in the positions (predetermined positions) on the substrate where the droplets were to be formed.

In each of the above-described embodiments 5-6 to 5-8, by starting to reduce the pressure in the enclosed space at the same time as finishing the step of forming the droplets, the first partial pressure is quickly lowered to the second partial pressure to quickly increase the degree of supersaturation of the solution forming the droplets so that a crystalline thin film of a single crystal is obtained. However, the timing of starting the depressurization is not limited to the same timing as finishing the step of forming the droplets, and the depressurization may be started at any suitable timing depending on other conditions, etc.

Embodiment 6-1

A solution was prepared by dissolving terthiophene (2,2':5',2"-terthiophene, thin film forming material) having the structure represented by the above-mentioned chemical formula (4) in dodecylbenzene (solvent) at a concentration of 0.1 weight %. The vapor pressure of dodecylbenzene at 20° C. (temperature at the time of ejection of the solution) is $1.3 \times 10^{-3}$ Pa ($1 \times 10^{-5}$ mmHg).

Also, ultraviolet rays with a wavelength of 172 nm were irradiated to a surface of a silicon substrate so that the substrate surface became lyophilic (namely the substrate surface had a property easily wettable with the solution). Using Ink Jet Device "MJ-930C" manufactured by Seiko Epson Corporation, the solution was ejected onto the surface of the silicon substrate in amount of 20 picoliter per droplet. The ejection was performed in a room at 20° C.

A head of the ink jet device employed here had a single nozzle. The ejection of the solution was repeated 10 times on condition that the distance between the head nozzle and the substrate was set to 1 $\mu$m and the amount of the ejected solution per droplet was set to 20 picoliter, while moving the head along one side of the substrate in units of 70 $\mu$m. As a result, 10 droplets of the solution were formed at pitch of 70 $\mu$m along one straight line on the silicon substrate. Subsequently, another 10 droplets were formed at pitch of 70 $\mu$m along another straight line spaced 70 $\mu$m from the above straight line in parallel. By repeating the above step ten times, droplets of 10 columns×10 rows were formed on the silicon substrate at pitch of 70 $\mu$m.

Then, the substrate was left to stand in the above condition, causing the solvent to evaporate from the solution for natural drying. During the drying, it was confirmed that all the formed droplets were kept in positions where they had been formed, without displacing from the respective positions. Then, after evaporation of the solvent, a thin film of terthiophene was formed in each of the positions where the droplets had been formed. Incidentally, the thin film of terthiophene was not a crystalline thin film, but an amorphous thin film.

Next, as a solution for a comparative example, a terthiophene solution with a concentration of 0.1 weight % was prepared using, instead of dodecylbenzene, 1,2,3,4-tetramethylbenzene having a vapor pressure of 26 Pa (0.2 mmHg) at 20° C. (temperature at the time of ejection of the solution) as the solvent. Droplets of 10 columns×10 rows were formed on the silicon substrate at pitch of 70 μm in the same manner as that described above except for using the solution thus prepared. The substrate was then left to stand in the above condition, causing the solvent to evaporate from the solution for natural drying.

During the drying, it was confirmed that, of the formed droplets of 10 columns×10 rows, the droplets in all the rows at the first column, all the rows at the tenth column, and the first and tenth rows at the second to ninth columns were all displaced. In other words, the droplets positioned at an outer periphery were all displaced.

Embodiment 6-2

A solution was prepared by dissolving Alq3 (quinolinol-aluminium complex, thin film forming material) having the structure represented by the above-mentioned chemical formula (7) in 2,3-dihydrobenzofuran (solvent) at a concentration of 0.1 weight %. The vapor pressure of 2,3-dihydrobenzofuran at 25° C. (temperature at the time of ejection of the solution) is $1.3 \times 10^2$ Pa ($1 \times 10^1$ mmHg).

Also, ultraviolet rays with a wavelength of 172 nm were irradiated to a surface of a silicon substrate so that the substrate surface became lyophilic (namely the substrate surface had a property easily wettable with the solution). Using Ink Jet Device "MJ-930C" manufactured by Seiko Epson Corporation, the solution was ejected onto the surface of the silicon substrate in amount of 20 picoliter per droplet. The ejection was performed in a room at 25° C.

A head of the ink jet device employed here had a single nozzle. As with Embodiment 6-1, droplets of 10 columns× 10 rows were formed on at each of pitches of 70 μm, 210 μm, 280 μm, 350 μm, 420 μm and 560 μm. The distance between the head nozzle and the substrate was set to 1 μm.

As a result, the droplets of 10 columns×10 rows were formed on the respective silicon substrate at pitch of 70 μm for a sample No. 1, at pitch of 210 μm for a sample No. 2, at pitch of 280 μm for a sample No. 3, at pitch of 350 μm for a sample No. 4, at pitch of 420 μm for a sample No. 5, and at pitch of 560 μm for a sample No. 6.

Then, the substrate of each sample was left to stand in the above condition, causing the solvent to evaporate from the solution for natural drying. During the drying, it was confirmed that, in the samples Nos. 4 to 6 in which the droplet were formed at pitch of not less than 350 μm, all the formed droplets were kept remain in positions where they had been formed, without displacing from the respective positions. Then, after evaporation of the solvent, a thin film of Alq3 was formed in each of the positions where the droplets had been formed. Incidentally, the thin film of Alq3 was not a crystalline thin film, but an amorphous thin film.

On the other hand, in the samples Nos. 1 to 3 in which the droplet were formed at pitch of not more than 280 μm, it was confirmed that, of the formed droplets of 10 columns×10 rows, the droplets in all the rows at the first column, all the rows at the tenth column, and the first and tenth rows at the second to ninth columns were all displaced. In other words, the droplets positioned at an outer periphery were all displaced.

The above results in this embodiment are presumably obtained for the following reason. By forming the droplets at intervals of not less than 350 μm between the adjacent ones, each droplet was brought into a condition in which it was not affected by vapors of the solvent (2,3-dihydrobenzofuran) evaporated from the adjacent droplets, and therefore the partial pressure of a gas of 2,3-dihydrobenzofuran was held even around each droplet.

Embodiment 6-3

Droplets were formed in accordance with the following method by ejecting droplets of a solution of Alq3 dissolved in 2,3-dihydrobenzofuran similarly to Embodiment 6-2. A description is made of the method used here with reference to FIG. 8.

Figure 8:
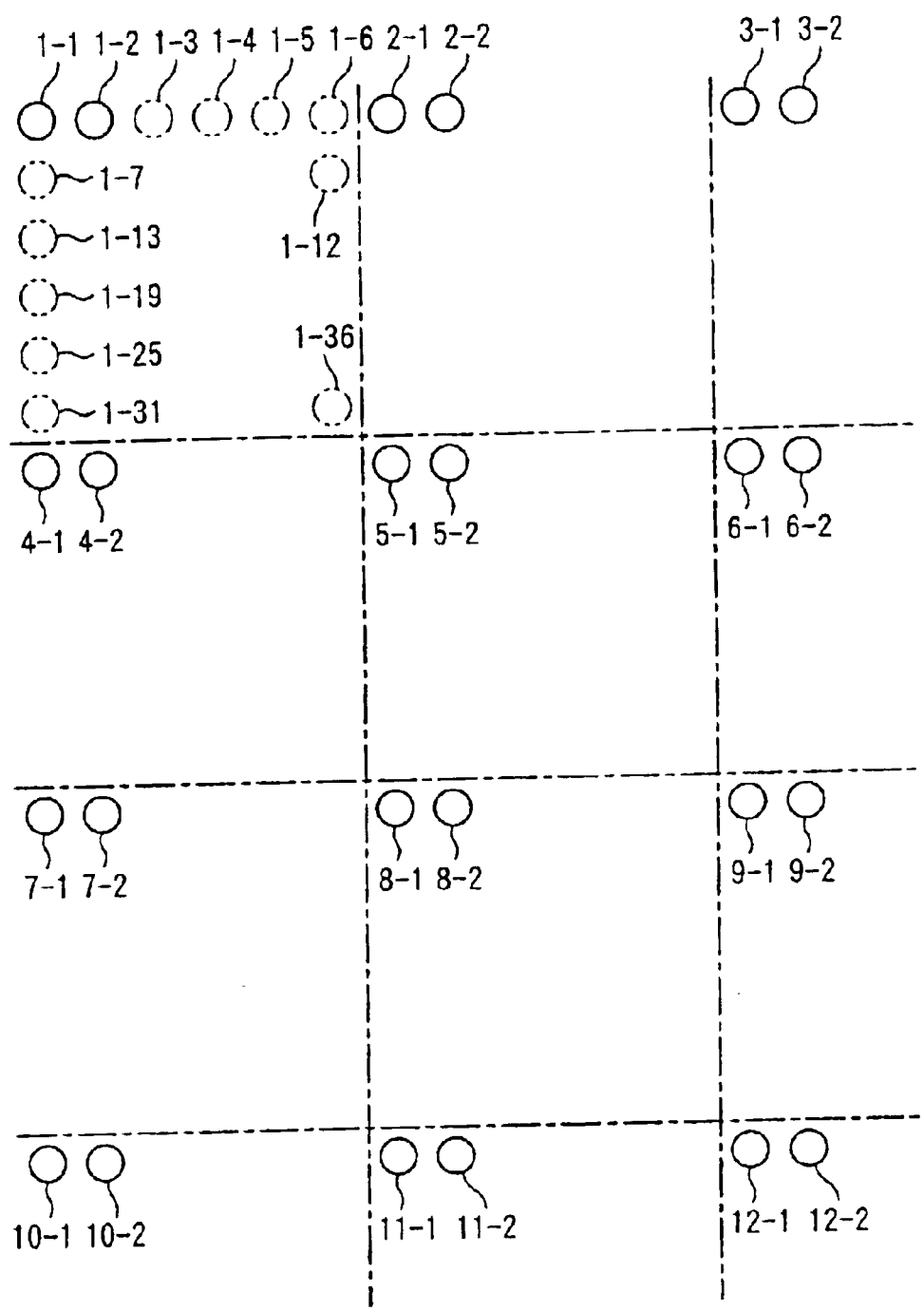
FIG. 8 is a plan view explaining a droplet forming sequence carried out in Embodiment 6-3.

First, one set of droplets of 3 columns×10 rows were formed at pitch of 350 μm by using a head having a single nozzle and ejecting the prepared solution while moving the head in sequence of 1-1, 2-1, 3-1, . . . , 30-1 in FIG. 8 (positions up to 12-2 are shown in FIG. 8). Then, another set of droplets of 3 columns×10 rows were formed at pitch of 350 μm by ejecting the prepared solution such that a droplet was formed in a position 1-2 spaced 70 μm to the right from 1-1 and thereafter the head was moved in sequence of 2-2, 3-2, . . . , 30-2.

After forming the droplets up to an array of 1-6 to 30-6 by repeating the above steps, still another set of droplets of 3 columns×10 rows were formed at pitch of 350 μm by ejecting the prepared solution such that a droplet was formed in a position 1-7 spaced 70 μm downward from 1-1 and thereafter the head was moved in sequence of 2-7, 3-7, . . . , 30-7.

By repeating the above-described process, 36 droplets were formed in a unit area, which defined each element of 3 columns×10 rows and was divided by boundary lines in the form of one-dot-chain lines in FIG. 8, at pitch of 70 μm in each of the vertical and horizontal directions. As a result, a total of 36'30 droplets were formed on the entire substrate surface at pitch of 70 μm in each of the vertical and horizontal directions.

Also, in this embodiment, the droplets were each successively in units of time ranging from 1 to 60 seconds in accordance with a head moving program. With such a head moving program, when forming a droplet (second droplet) in a position spaced 70 μm from an adjacent droplet (first droplet) having been already formed, the first droplet was in a dried state.

Thus, according to the method of this embodiment, the droplets formed at the same time or substantially at the same time were formed at pitch of 350 μm at which each droplet was not affected by solvent vapors evaporated from the adjacent droplet, and the droplets were each formed in a position adjacent to the already-formed droplet after being brought into the dried state. Therefore, the partial pressure of a gas of 2,3-dihydrobenzofuran was held even around each droplet. It was hence confirmed that all the formed droplets were kept remain in positions where they had been formed, without displacing from the respective positions.

The method of forming the sequence, in which a plurality of droplets are formed such that the second droplet is formed in the position adjacent to the already-formed first droplet after drying of the first droplet, is performed, for example, by dividing the substrate surface into a plurality of areas, forming one droplet in a certain area and then forming a next droplet in a succeeding area, like this embodiment, whereby the droplets are formed in adjacent positions within each area while maintaining a sufficient time between the steps of forming those droplets.

As another example, the above method may be performed as follows. After forming droplets in positions at four corners of the substrate, a droplet is formed at the center. Droplets are then formed in positions between the four corners, and so on. Thus, the sequence of forming the droplets are set such that a total distance of movement of the ink jet head is minimized in consideration of the productivity, while ensuring that the second droplet is formed in the position adjacent to the already-formed first droplet after drying of the first droplet.

By using such a method, all the droplets can be each formed after the adjacent droplet has been dried. In addition, to enhance the productivity, an optimum method can be set by carrying out a simulation based on the array and size of the droplets, the vapor pressure of the used solvent, etc.

Embodiment 6-4

A thin film was formed on the silicon substrate using the thin film forming apparatus shown in FIG. 1. The thin film forming apparatus includes an enclosed container 1, an X-Y stage 2 mounted in the enclosed container 1, a head 3 of an ink jet device, and a pump 6 and a pipe 7 to reduce the pressure in the enclosed container 1. The head 3 is fixed to a top portion of the enclosed container 1, and a solution is supplied to the head 3 from the outside. The head 3 and the X-Y stage 2 are disposed in positions facing each other. The pipe 7 for the pump 6 is connected to a bottom portion of the enclosed container 1.

The solution was first prepared by dissolving terthiophene (thin film forming material) in dodecylbenzene (solvent) at a concentration of 0.1 weight % while holding the enclosed container (enclosed space) 1 at 25° C., and was then ejected on the silicon substrate by the ink jet method in the same manner as in Embodiment 6-3. While the positions where the droplets were to be arranged were selected by moving the head 3 in Embodiment 6-3, they were selected by moving the X-Y stage 2 in this embodiment.

The saturation concentration of terthiophene with respect to dodecylbenzene at 25° C. (temperature at the time of ejection of the solution) is 1.0 weight %. Therefore, the concentration of terthiophene in the solution was 1/10 of the saturation concentration at the time of ejection of the solution.

At the same time as finishing the above step of forming the droplets, operation of the depressurizing pump 6 was started to reduce the pressure in the enclosed space to 1.3 Pa (10-2 torr), and this depressurized state was held for 6 hours. On the silicon substrate 10 taken out of the enclosed space after 6 hours, a thin film (thickness of 50 mm) of terthiophene in a nearly rectangular shape of 20 $\mu$m×30 $\mu$m was formed substantially in a single crystal condition at each of the positions where the droplets had been formed. The single-crystal thin film of terthiophene is a functional thin film suitably usable as an organic semiconductor film.

In this embodiment, since the concentration of the solution at the time of ejection thereof was 1/10 of the saturation concentration, the solution forming the droplets were relatively easily brought into a supersaturated state immediately after being arranged on the substrate. Also, by forming the droplets at pitch of 70 $\mu$m with the amount of the ejected solution per droplet set to 20 picoliter, the partial pressure of a gas of dodecylbenzene (i.e., the same components as those of the solvent) in the vicinity of the droplets was held at a high partial pressure under which dodecylbenzene (solvent) was hard to evaporate from the solution in the form of the droplets. Presumably, in those situations, the solution in the form of the droplets was stabilized in the supersaturated state at a relatively low degree of supersaturation and a small number of nuclei were formed.

Furthermore, presumably, by starting to reduce the pressure in the enclosed space at the same time as finishing the step of forming the droplets, the partial pressure of solvent vapors in the vicinity of the droplets were quickly lowered in the stage in which a small number of nuclei were formed, and the degree of supersaturation of the solution in the form of the droplets was quickly increased, thus leading to a state in which growth of the crystalline nuclei into crystals occurred with priority to creation of further crystalline nuclei. Then, the crystal growth was accelerated by holding such a depressurized state for 6 hours.

Further, it is thought that since a solvent having a low vapor pressure was used as the solvent, all the formed droplets were kept remain in the positions where they had been formed, without displacing from the respective positions, and crystalline thin films were formed in the positions (predetermined positions) on the substrate where the droplets were to be formed.

Embodiment 6-5

A solution was prepared by dissolving 4-amino-p-terphenyl (derivative of terpheniyl, thin film forming material) having the structure represented by the above-mentioned chemical formula (5) in dimethylformamide (solvent) at a concentration of 1.0 weight %. The saturation concentration of 4-amino-p-terphenyl with respect to dimethylformamide at 25° C. (temperature at the time of ejection of the solution) is 1.0 weight %. In this solution, therefore, 4-amino-p-terphenyl was brought into a saturated state at the time of ejection of the solution.

Droplets were formed exactly in the same manner as that in Embodiment 6-4 except for using the solution thus prepared.

At the same time as finishing the above step of forming the droplets, operation of the depressurizing pump 6 was started to reduce the pressure in the enclosed space to 1.3 Pa (10-2 torr), and this depressurized state was held for 6 hours. On the silicon substrate 10 taken out of the enclosed space after 6 hours, a thin film (thickness of 50 mm) of 4-amino-p-terphenyl in a nearly rectangular shape of 20 $\mu$m×30 $\mu$m was formed substantially in a single crystal condition at each of the positions where the droplets had been formed. The crystalline thin film of 4-amino-p-terphenyl is a functional thin film suitably usable as a semiconductor film for various kinds of electronic devices.

In this embodiment, a small number of nuclei were presumably formed because of not only that the solution was brought into the saturated state at the time of ejection thereof and hence the solution forming the droplets were relatively easily brought into the supersaturated state immediately after being arranged on the substrate, but also the similar action as obtained in Embodiment 6-4. Also, presumably, the crystal growth was accelerated because of the similar action as obtained in Embodiment 6-4.

Embodiment 6-6

A solution was prepared by dissolving 2,2':5',2"-terthiophene-5,5"-dicarboxyaldehyde (derivative of terthiophene, thin film forming material) having the structure represented by the above-mentioned chemical formula (6) in dimethylformamide (solvent) at a concentration of 1.0 weight %. The saturation concentration of the derivative with respect to dimethylformamide at 25° C. (temperature at the time of ejection of the solution) is 1.0 weight %. In this solution, therefore, the derivative was brought into a saturated state at the time of ejection of the solution.

Droplets were formed exactly in the same manner as that in Embodiment 6-4 except for using the solution thus prepared.

At the same time as finishing the above step of forming the droplets, operation of the depressurizing pump 6 was started to reduce the pressure in the enclosed space to 1.3 Pa (10-2 torr), and this depressurized state was held for 6 hours. On the silicon substrate 10 taken out of the enclosed space after 6 hours, a thin film (thickness of 50 mm) of 2,2':5',2"-terthiophene-5,5"-dicarboxyaldehyde in a nearly rectangular shape of 20 μm×30 μm was formed substantially in a single crystal condition at each of the positions where the droplets had been formed. The crystalline thin film of 2,2':5',2"-terthidphene-5,5"-dicarboxyaldehyde is a functional thin film suitably usable as a semiconductor film for various kinds of electronic devices.

In this embodiment, a small number of nuclei were presumably formed because of not only that the solution was brought into the saturated state at the time of ejection thereof and hence the solution forming the droplets were relatively easily brought into the supersaturated state immediately after being arranged on the substrate, but also the similar action as obtained in Embodiment 6-4. Also, presumably, the crystal growth was accelerated because of the similar action as obtained in Embodiment 6-4.

In each of the above-described embodiments 6-4 to 6-6, by starting to reduce the pressure in the enclosed space at the same time as finishing the step of forming the droplets, the first partial pressure is quickly lowered to the second partial pressure to quickly increase the degree of supersaturation of the solution forming the droplets so that a crystalline thin film of a single crystal is obtained. However, the timing of starting the depressurization is not limited to the same timing as finishing the step of forming the droplets, and the depressurization may be started at any suitable timing depending on other conditions, etc.

Embodiment 7

The crystalline thin film formed according to the method of the present invention is suitably usable as a semiconductor film for various kinds of electronic devices (e.g., a light emitting layer, a hole injection/transport layer, and an electron injection/transport layer in organic EL device, diodes, capacitors, and transistors). Also, displays employing electronic devices, in which thin films are formed according to the method of the present invention, include a liquid crystal display, an organic EL display, etc. Those displays can be applied to various kinds of electronic equipment shown in, by way of example, FIGS. 9(a)–9(c).

Figure 9:
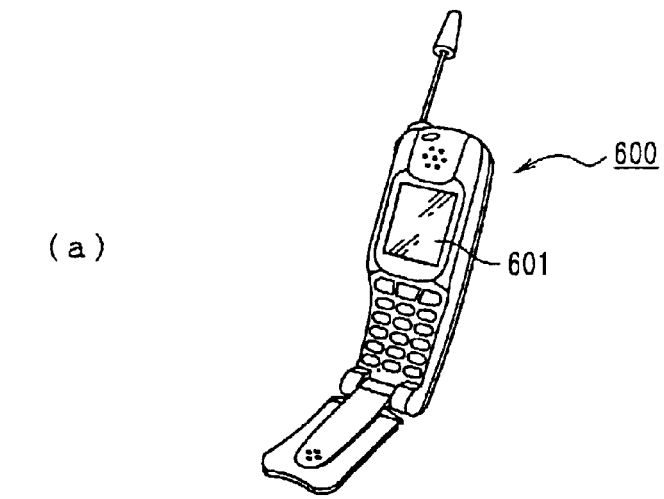
FIGS. 9(a) to 9(c) are perspective views showing examples of electronic equipment provided with displays including an electronic device in which a thin film is formed by the method of the present invention.
Figure 9:
Figure 9:
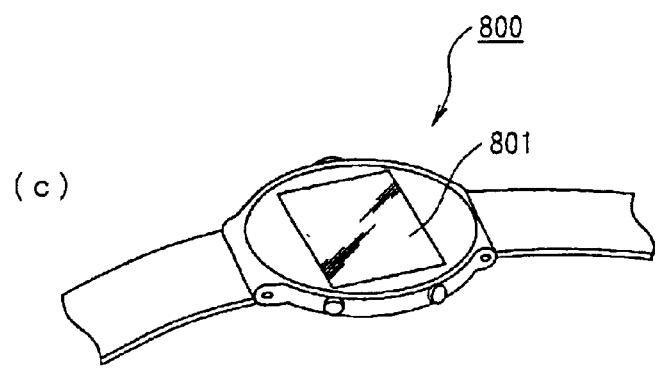

FIG. 9(a) is a perspective view showing one example of a cellular phone. In FIG. 9(a), numeral 600 denotes a body of the cellular phone, and 601 denotes a display section using the display including the thin films formed according to the method of the present invention.

FIG. 9(b) is a perspective view showing one example of a portable information processing unit such as a word processor or a personal computer. In FIG. 9(b), numeral 700 denotes an information processing unit, and 701 denotes an input section, such as a keyboard. Numeral 703 denotes a body of the information processing unit, and 702 denotes a display section using the display including the thin films formed according to the method of the present invention.

FIG. 9(c) is a perspective view showing one example of a wristwatch type electronic device. In FIG. 9(c), numeral 800 denotes a watch body, and 801 denotes a display section using the display including the thin films formed according to the method of the present invention.

The electronic equipment shown in each of FIGS. 9(a) to 9(c) includes, as the display section, the display employing electronic devices, in which crystalline thin films formed according to any of the methods described in the above embodiments, and has the features of the thin film forming method of the present invention. Therefore, the thin film forming method of the present invention makes it possible to facilitate the method of manufacturing that electronic equipment.

What is claimed is:

1. A thin film forming method, comprising:
   arranging, on a substrate, droplets of a solution prepared by dissolving a thin film forming material in a solvent;
   controlling a partial pressure of a gas made up of the same components as those of the solvent in the vicinity of the droplets, thereby creating crystalline nuclei in said droplets; and
   then growing the crystalline nuclei to form a crystalline thin film.

2. The thin film forming method according to claim 1, said droplet arranging being performed by ejecting the solution toward said substrate, and the solution containing the thin film forming material in amount at which the solution is brought into a saturated state at the time of ejection of the solution.

3. The thin film forming method according to claim 1, said droplet arranging being performed by ejecting the solution toward said substrate, and the solution containing the thin film forming material in amount at which concentration of the solution becomes not less than $\frac{1}{10}$ of the saturated concentration but less than the saturated concentration at the time of ejection of the solution.

4. The thin film forming method according to claim 1, said droplet arranging being performed by ejecting the solution toward said substrate, and the solution containing the thin film forming material in amount at which the solution is brought into a supersaturated state at the time of ejection of the solution.

5. The thin film forming method according to claim 1, the solvent being a poor solvent.

6. The thin film forming method according to claim 1, said droplet arranging being performed by ejecting the solution toward said substrate, and the solvent having such a characteristic that the saturated concentration of the thin film forming material at the time of ejection of the solution is not less than 0.1 weight % but not more than 10.0 weight %.

7. The thin film forming method according to claim 1, said droplet arranging step being performed by ejecting the solution toward said substrate, and the solvent having such a characteristic that the saturated concentration of the thin film forming material at the time of ejection of the solution is not less than 0.1 weight % but not more than 1.0 weight %.

8. The thin film forming method according to claim 1, the solvent being dodecylbenzene.

9. The thin film forming method according to claim 1, the solvent being 2-3-dihydrobenzofuran.

10. The thin film forming method according to claim 1, the solvent being dimethylformamide.

11. The thin film forming method according to claim 1, the thin film forming material being oligophenylene or a derivative thereof.

12. The thin film forming method according to claim 1, the thin film forming material being oligothiophene or a derivative thereof.

13. The thin film forming method according to claim 1, the thin film forming material being oligophenylene and the solvent being 2-3-dihydrobenzofuran.

14. The thin film forming method according to claim 1, the thin film forming material being oligothiophene and the solvent being dodecylbenzene.

15. The thin film forming method according to claim 1, the thin film forming material being a derivative of oligophenylene or a derivative of oligothiophene, and the solvent being dimethylformamide.

16. The thin film forming method according to claim 1, said droplet arranging being performed by ejecting the solution toward said substrate, and the solution being ejected after treating said substrate into a surface condition having an affinity with the thin film forming material.

17. A thin film forming method, comprising:
arranging, on a substrate, droplets of a solution prepared by dissolving a thin film forming material in a solvent;
creating crystalline nuclei in the droplets by controlling a partial pressure of a gas made up of the same components as those of the solvent in the vicinity of each of the arranged droplets to a first partial pressure under which the solution forming the droplets is brought into a supersaturated state; and
after creation of the crystalline nuclei, lowering the partial pressure of said gas in the vicinity of the droplets to a second partial pressure under which the crystalline nuclei are able to grow into crystals.

18. The thin film forming method according to claim 17, the partial pressure control to said first partial pressure being performed by adjusting an array pitch of the droplets.

19. The thin film forming method according to claim 17, the partial pressure control to said first partial pressure being performed by adjusting an amount of the solution forming each of the droplets.

20. The thin film forming method according to claim 17, the partial pressure control to said first partial pressure being performed by adjusting the partial pressure of said gas in positions where the droplets are to be arranged, prior to arranging the droplets on said substrate.

21. The thin film forming method according to claim 17, an atmosphere in the vicinity of the droplets being depressurized to lower the partial pressure of said gas to said second partial pressure.

22. The thin film forming method according to claim 17, said second partial pressure being relatively lowered by raising temperature in the vicinity of the droplets and increasing a saturated vapor pressure of the solution.

23. The thin film forming method according to claim 17, an atmosphere in the vicinity of the droplets being replaced with an atmosphere of inert gas for lowering the partial pressure of said gas to said second partial pressure.

24. A thin film forming method, comprising:
arranging, on a substrate, droplets of a solution prepared by dissolving a thin film forming material in a solvent;
creating crystalline nuclei in the droplets by bringing the solution forming the arranged droplets into a supersaturated state and by controlling a partial pressure of a gas made up of the same components as those of the solvent in the vicinity of the droplets to a first partial pressure under which the solvent is hard to evaporate from the solution forming the droplets; and
after creation of the crystalline nuclei, lowering the partial pressure of said gas in the vicinity of the droplets to a second partial pressure under which growth of the crystalline nuclei into crystals occurs with priority to creation of further crystalline nuclei.

25. A thin film forming method, comprising:
ejecting a solution prepared by dissolving a thin film forming material in a solvent;
arranging a plurality of droplets of the solution on a substrate;
evaporating the solvent from each droplet to form a thin film on said substrate; and
making control such that a gas made up of the same components as those of the solvent is present around the droplets.

26. The thin film forming method according to claim 25, said control being performed by coating the solvent on said substrate.

27. The thin film forming method according to claim 26, the solution being ejected after coating the solvent on said substrate.

28. The thin film forming method according to claim 26, the solvent being coated only in positions where the droplets of the solution are not to be arranged.

29. The thin film forming method according to claim 26, the solvent being coated by a spin coating method.

30. The thin film forming method according to claim 26, the solvent being coated by an ink jet method.

31. The thin film forming method according to claim 30, the droplets of the solvent and the droplets of the solution being formed by the ink jet method such that the droplets of the solvent are evenly arranged around the droplets of the solution on the substrate.

32. The thin film forming method according to claim 25, the thin film forming material being oligophenylene or a derivative thereof.

33. The thin film forming method according to claim 25, the thin film forming material being oligothiophene or a derivative thereof.

34. The thin film forming method according to claim 25, the method further including: creating crystalline nuclei in the droplets by bringing the solution forming the arranged droplets into a supersaturated state and by controlling a partial pressure of a gas made up of the same components as those of the solvent in the vicinity of the droplets to a first partial pressure under which the solvent is hard to evaporate from the solution forming the droplets; and after creation of the crystalline nuclei, lowering the partial pressure of said gas in the vicinity of the droplets to a second partial pressure under which growth of the crystalline nuclei into crystals occurs with priority to creation of further crystalline nuclei.

35. A thin film forming method, comprising:
ejecting a solution prepared by dissolving a thin film forming material in a solvent;
arranging a plurality of droplets of the solution on a substrate;
evaporating the solvent from each droplet to form a thin film on said substrate; and
utilizing a low vapor-pressure solvent having a vapor pressure of not higher than $1.3 \times 10^{-3}$ Pa ($1 \times 10^{-5}$ mmHg) at the time of ejection of the solution as the solvent.

36. A thin film forming method, comprising:
ejecting a solution prepared by dissolving a thin film forming material in a solvent;
arranging a plurality of droplets of the solution on the substrate;
evaporating the solvent from each droplet to form a thin film on the substrate; and
after forming a first droplet, forming a second droplet in a position away a predetermined distance from a position in which the first droplet has been formed.

37. A thin film forming method, comprising:
ejecting a solution prepared by dissolving a thin film forming material in a solvent;
arranging a plurality of droplets of the solution on the substrate;
evaporating the solvent from each droplet to form a thin film on the substrate; and
forming a second droplet in a position adjacent to a first droplet after drying of the first droplet.

* * * * *